United States Patent
Chen et al.

(10) Patent No.: US 8,938,698 B2
(45) Date of Patent: Jan. 20, 2015

(54) SYSTEMS AND METHODS OF AUTOMATICALLY DETECTING FAILURE PATTERNS FOR SEMICONDUCTOR WAFER FABRICATION PROCESSES

(71) Applicant: Taiwan Semiconductor Manufacturing Co., Ltd., Hsin-Chu (TW)

(72) Inventors: Jui-Long Chen, Taichung (TW); Hui-Yun Chao, Zhubei (TW); Yen-Di Tsen, Chung-Ho (TW); Jong-I Mou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/108,392

(22) Filed: Dec. 17, 2013

(65) Prior Publication Data

US 2014/0106474 A1  Apr. 17, 2014

Related U.S. Application Data

(63) Continuation of application No. 13/455,186, filed on Apr. 25, 2012, now Pat. No. 8,627,251.

(51) Int. Cl.
*G06F 17/50* (2006.01)

(52) U.S. Cl.
CPC .............. *H04L 22/10* (2013.01); *H04L 22/20* (2013.01); *H04L 22/12* (2013.01); *H04L 22/14* (2013.01)
USPC .......................................................... 716/54

(58) Field of Classification Search
USPC .................................. 716/100, 54
See application file for complete search history.

(56) References Cited

U.S. PATENT DOCUMENTS

| | | | | |
|---|---|---|---|---|
| 5,390,131 | A  * | 2/1995  | Rohrbaugh et al. | 702/118 |
| 5,787,190 | A  * | 7/1998  | Peng et al. | 382/145 |
| 7,068,363 | B2   | 6/2006  | Bevis et al. | |
| 7,138,283 | B2   | 11/2006 | Matsushita et al. | |
| 7,968,354 | B1 * | 6/2011  | Haller et al. | 438/14 |
| 8,081,814 | B2   | 12/2011 | Matsushita et al. | |
| 8,108,805 | B2   | 1/2012  | Rathsack | |
| 8,627,251 | B2 * | 1/2014  | Chen et al. | 716/112 |
| 2004/0246476 | A1 | 12/2004 | Bevis et al. | |
| 2005/0021303 | A1 | 1/2005 | Matsushita et al. | |
| 2005/0273753 | A1 * | 12/2005 | Sezginer | 716/21 |
| 2008/0315196 | A1 * | 12/2008 | Aghababazadeh et al. | 257/48 |

(Continued)

*Primary Examiner* — Suchin Parihar
(74) *Attorney, Agent, or Firm* — Duane Morris LLP

(57) ABSTRACT

A system and method of automatically detecting failure patterns for a semiconductor wafer process is provided. The method includes receiving a test data set collected from testing a plurality of semiconductor wafers, forming a respective wafer map for each of the wafers, determining whether each respective wafer map comprises one or more respective objects, selecting the wafer maps that are determined to comprise one or more respective objects, selecting one or more object indices for selecting a respective object in each respective selected wafer map, determining a plurality of object index values in each respective selected wafer map, selecting an object in each respective selected wafer map, determining a respective feature in each of the respective selected wafer, classifying a respective pattern for each of the respective selected wafer maps and using the respective wafer fingerprints to adjust one or more parameters of the semiconductor fabrication process.

19 Claims, 17 Drawing Sheets

(56) References Cited

U.S. PATENT DOCUMENTS

| | | |
|---|---|---|
| 2009/0220142 A1 | 9/2009 | Matsushita et al. |
| 2010/0304509 A1* | 12/2010 | Aghababazadeh et al. ..... 438/17 |
| 2011/0054659 A1* | 3/2011 | Carlson et al. ................ 700/109 |
| 2011/0190919 A1* | 8/2011 | Kiermasz ...................... 700/110 |
| 2011/0239167 A1 | 9/2011 | Rathsack |
| 2012/0008127 A1* | 1/2012 | Tel et al. ......................... 355/77 |
| 2012/0255795 A1* | 10/2012 | Fenske et al. ..................... 177/1 |
| 2013/0288403 A1* | 10/2013 | Chen et al. ...................... 438/16 |

* cited by examiner

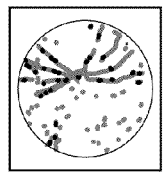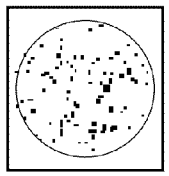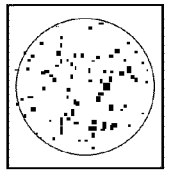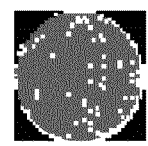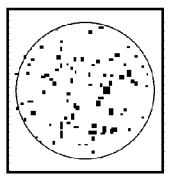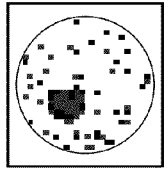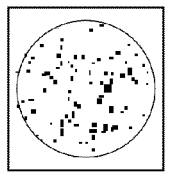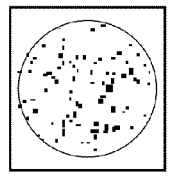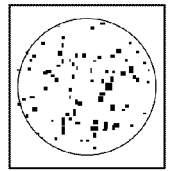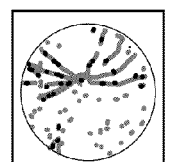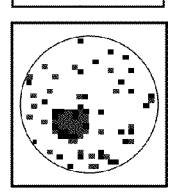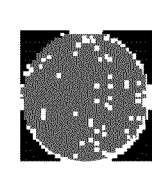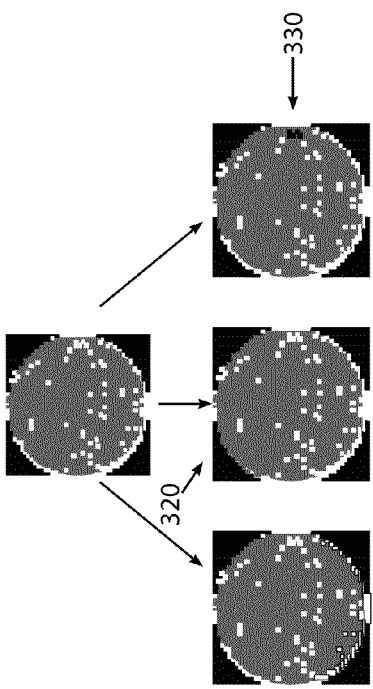
FIG. 3A    FIG. 3B    FIG. 3C

| Object | Index 1 | Index 2 |
|---|---|---|
| 410 | 365 | 80 |
| 415 | 3 | 3 |
| 420 | 15 | 30 |
| 425 | 4 | 5 |
| 430 | 6 | 8 |
| 435 | 3 | 2 |
| 440 | 8 | 10 |
| 445 | 6 | 15 |
| 450 | 6 | 8 |
| 455 | 1 | 1 |
| 460 | 1 | 1 |
| 465 | 1 | 1 |
| 470 | 1 | 1 |
| 475 | 2 | 2 |
| 480 | 2 | 2 |
| 485 | 1 | 1 |

FIG. 4B

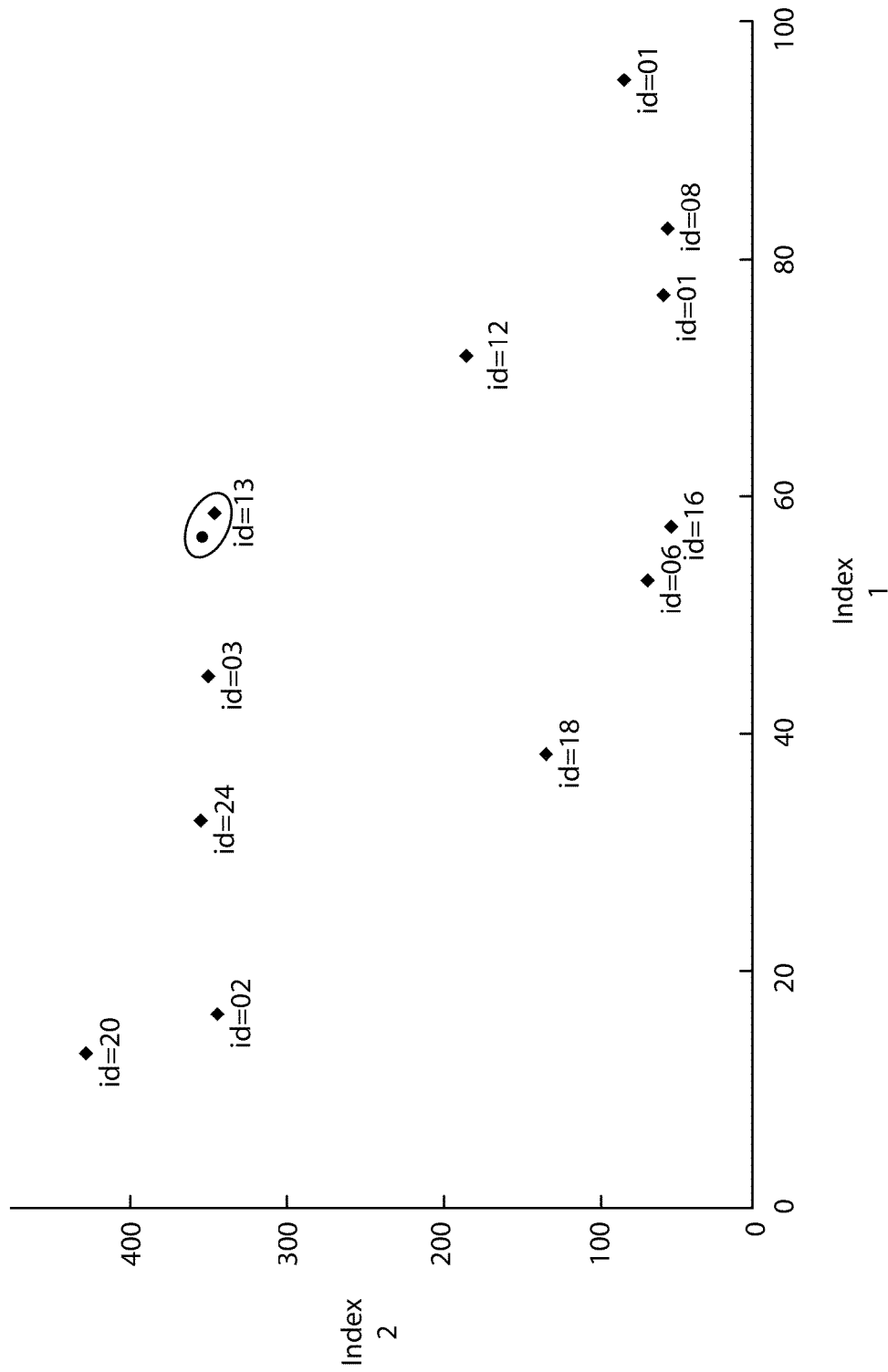

SYSTEMS AND METHODS OF AUTOMATICALLY DETECTING FAILURE PATTERNS FOR SEMICONDUCTOR WAFER FABRICATION PROCESSES

CROSS-REFERENCE TO RELATED APPLICATIONS

This application is a continuation application of and claims priority to U.S. patent application Ser. No. 13/455,186, filed on Apr. 25, 2012, the entirety of which is herein incorporated by reference.

FIELD

The present disclosure is directed generally to semiconductor wafer fabrication processes and more particularly to systems and methods to analyze failures in semiconductor wafer fabrication processes.

DESCRIPTION OF THE RELATED ART

Integrated circuits are produced by a plurality of complex semiconductor fabrication processes in a semiconductor wafer fabrication facility. Maintaining a high yield in semiconductor fabrication processes continues to be a critical factor in reducing the costs of device fabrication. However, despite the sophistication of semiconductor wafer fabrication facilities and expense of semiconductor manufacturing tools, achieving a high yield remains a difficult accomplishment. For example, the natural variation inherent in processes performed in semiconductor fabrication facilities, tool function changes or drift, inadequate sacrificial film removal, tool imperfections, contamination, and/or tool miscalibration are all challenges facing semiconductor fabrication facilities that can cause unacceptable levels of chip failures. Failure analysis is therefore critical to solution identification and maximizing yield.

Failure analysis methods involve manual "eyeball" techniques in which semiconductor process engineers examine selected sample wafers, check for failure results and manually classify the wafers into failure patterns. These non-systematic processes are labor-intensive, time-consuming, limited to small sub-sets of the high volume of semiconductor wafers that are manufactured daily and will be unable to meet Giga Fab and future 450 mm targets.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

FIGS. 3A-3D are simplified diagrams of wafer maps according to various embodiments of the present disclosure.

FIG. 4B illustrates a simplified chart of a plurality of object index values for according to various embodiments.

FIG. 4C illustrates a diagram showing a step of feature determination using a pair of object indices and stored feature information according to embodiments of the present disclosure.

DETAILED DESCRIPTION OF THE EXAMPLES

Figure 1:
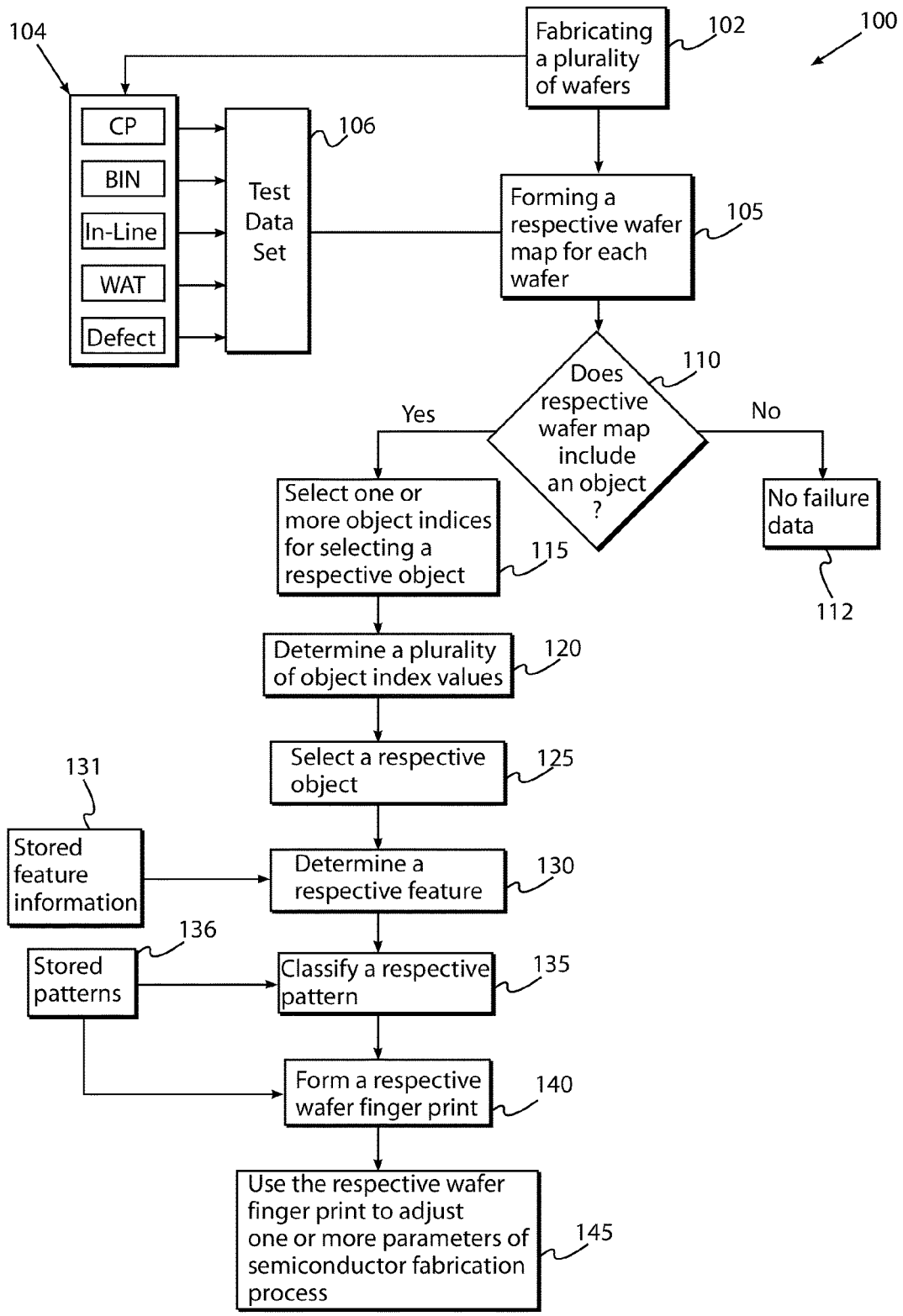
FIG. 1 is a flow chart illustrating a method of automatically detecting failure patterns for a semiconductor wafer fabrication process according to embodiments of the present disclosure.

With reference to the Figures, where like elements have been given like numerical designations to facilitate an understanding of the drawings, the various embodiments of a system and a method of automatically detecting failure patterns for a semiconductor wafer fabrication process are described. The figures are not drawn to scale.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the disclosure. Relative terms such as "lower," "upper," "horizontal," "vertical,", "above," "below," "up," "down," "top," "normal" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Moreover, various features and benefits are illustrated by reference to the exemplary embodiments. Accordingly, the subject matter of this disclosure and the appended claims are expressly not limited to such exemplary embodiments.

As used herein, use of a singular article such as "a," "an" and "the" does not exclude pluralities of the article's object unless the context clearly and unambiguously dictates otherwise.

Failure pattern recognition at various stages of wafer fabrication processing, handling and transfer is used for rapid semiconductor fabrication problem identification and to maximizing yield Improved systems and methods of automatically detecting failure patterns for a semiconductor wafer fabrication process are provided. The systems and processes described herein are not limited to any specific semiconductor process technology, production area, equipment, technology node, fabrication tool, wafer size, etc. The processes described herein can be performed by apparatus including among its components any suitable commercially available equipment commonly used in the art to fabricate semiconductor wafers, or alternatively, using future developed equipment. The inventors have developed systems and methods of automatically detecting failure patterns determined at various stages of wafer transfer, handling and processing for a semiconductor wafer fabrication process to improve process quality, and yields and reduce costs associated with failure pattern recognition.

The inventors have discovered a fast and reliable method and system for automatically classifying and clustering failure patterns that provides accurate failure pattern recognition and tunable pattern ranking. The inventors have observed that a combination of knowledge and statistical based algorithms can be utilized to automatically detect and recognize failure patterns for collected failure test data. The inventors have developed a system and method that is adaptive and self-learning in that as more failure data are received into the system, more refined failure features and patterns can be determined and new features and patterns can be formed. Thus, the system and method will continue to provide improved accuracy in failure pattern recognition as more failure data is analyzed and the library of wafer fingerprints is further developed. The inventors have also determined a reliable method and system of automatically determining the strength of correlation of new features and patterns in a tunable ranking system.

FIG. 1 is a flow chart illustrating a method 100 of automatically detecting failure patterns for a semiconductor wafer fabrication process. At block 102, a plurality of semiconductor wafers are fabricated. A variety of test data is collected from fabricated wafers that have completed production as illustrated at blocks 104 and 106. At block 104, circuit performance (CP) tests, in-line defect tests, bin tests, wafer acceptance tests (WAT or electrical test method) and/or defect tests can be performed by applying the appropriate test criteria to the fabricated wafers. For example, a defect map can be formed using KLA-Tencor equipment. At block 106, a test data set is collected from testing the fabricated wafers at block 104. At block 105, a respective wafer map is formed for each of the wafers based on the collected test data set. For example, during the fabrication process of the plurality of semiconductor wafers, various in-process layers of each of the plurality of wafers can be verified by an in-line defect test to collect a test data set. A respective wafer map can be formed for each wafer using the test data collected and/or measured at various points on various in-line process layers (e.g. film deposition layers, lithography layers, etching layers, diffusion layers) of the wafer. In some embodiments, wafer maps can be generated based on a test data set measured at various points at each of the various in-process layers during fabrication of each of the plurality of wafers. The measurement points can be organized to form a wafer map.

At block 110, in various embodiments, the method determines whether each respective wafer map includes one or more respective objects. An object, as defined herein, is a collection of test data on a wafer map formed for a respective wafer that is indicative of wafer failure. In various embodiments, an object can be a collection of test data formed by two or more adjacent failure die. In some embodiments, the step of determining whether each respective wafer map includes one or more respective objects can include discriminating failure data from noise on each respective wafer map. For example, a k-nearest neighbor algorithm may be used in discriminating objects from noise and in separating the failure data on the wafer map into discrete objects. Further by way of example, a linear discriminant analysis (LDA) can be performed to discriminate failure data from noise and to separate the failure data on the wafer map into discrete objects. At block 112, if no objects are determined to be present on a wafer map, then the wafer is determined to be suitable for use and no further processing is performed on the wafer map. In some embodiments, the non-defect wafer maps can be discarded. In other embodiments, a respective wafer map is only generated if test data for a respective wafer includes failure data forming one or more respective objects. At block 110, if a respective wafer map is determined to include one or more respective objects, the respective wafer map is selected for further processing.

In various embodiments, a respective wafer map can be determined to include one object. In other embodiments, a respective wafer map can be determined to include two or more objects. If the wafer map is determined to include more than one object, then the wafer map can be segmented by object where each object in the wafer map is individually processed as described below. In some embodiments, a wafer map can be split into several sub-wafer maps, each containing a subset of the failure data for a particular wafer map.

At block 115, one or more object indices for selecting a respective object in each respective selected wafer map of the plurality of wafer maps are selected. As used herein, an object index for selecting an object on a wafer map is a mechanism for describing the object. For example, objects can have different relative dimensions and different relative locations on a wafer map. The object index thus provides a mechanism for describing the object's dimensions, location, spatial positioning, etc. relative to the wafer map. In some embodiments, an object index can include, but is not limited to, an index defining a measurement of the number of failure dies in the object (e.g. a geography length, a geography area, a geography width, a geography height), a centroid distance, a number of pixels, a distance or an angle relative to a center or an edge of the wafer map or to some other relative fixed location of the wafer map, an object perimeter distance, a circumference, an inner circumference, an outer circumference, a differential circumference, a diameter, a radius, a differential radius, a wafer map perimeter distance, a wafer map percent coverage, a distance from a fixed point on the wafer map to a centroid distance, a distance from a fixed point on the wafer map to a fixed point of the object, a major axis length, a minor axis length, a bounding box, etc.

In various embodiments, an object index can be measured relative to the center of the wafer map. In some embodiments, an object index can be measured relative to some fixed point on the wafer map. In various embodiments, the method can use, for example, standardized rectangular or polar coordinate systems, or other Euclidean coordinate system to enhance object selecting techniques. In various embodiments, an object index can define one or more respective attributes of an object. In some embodiments, an object index can define a respective position-independent object related attribute. For example, an object index can define the shape or size of an object. In other embodiments, an object index can define a position-dependent object related attribute. For example, an object index can define the relative position or percent coverage of the object relative to the wafer map.

According to various embodiments, one or more respective object indices for selecting a respective object on each of the respective selected wafer maps are selected at block 115. For example, geography length and geography area can be selected for selecting a respective object on a respective wafer map. By way of example, the one or more indices can be selected based on the dimensions of the objects on the wafer map. Further by way of example, the one or more indices can be selected based on the spatial positioning of the objects relative to the wafer map. Further by way of example, a geography area and a perimeter distance may be selected as indices for selecting a respective object on each of the respective selected wafer maps.

At block 120, a plurality of object index values in each respective selected wafer map are determined using each of the respective selected one or more object indices. In various embodiments, the resultant values using the one or more selected object indices are calculated for each object in each respective selected wafer map to select an object. For example, the resultant values for geography area and perimeter distance are calculated for each object in each respective selected wafer map of the plurality of wafer maps to select an object.

At block 125, a respective object is selected in each respective selected wafer map based on the determined plurality of object index values. For example, the object having the maximum object index values of geography area and perimeter distance can be selected. By way of example, the object having the minimum object index value (e.g. differential circumference between an outer circumference and an inner circumference) can be selected. In various embodiments, two or more objects can be selected in one or more of the respective selected wafer maps based on the determined plurality of object index values and stored object index values for the selected one or more object indices.

Figure 2:
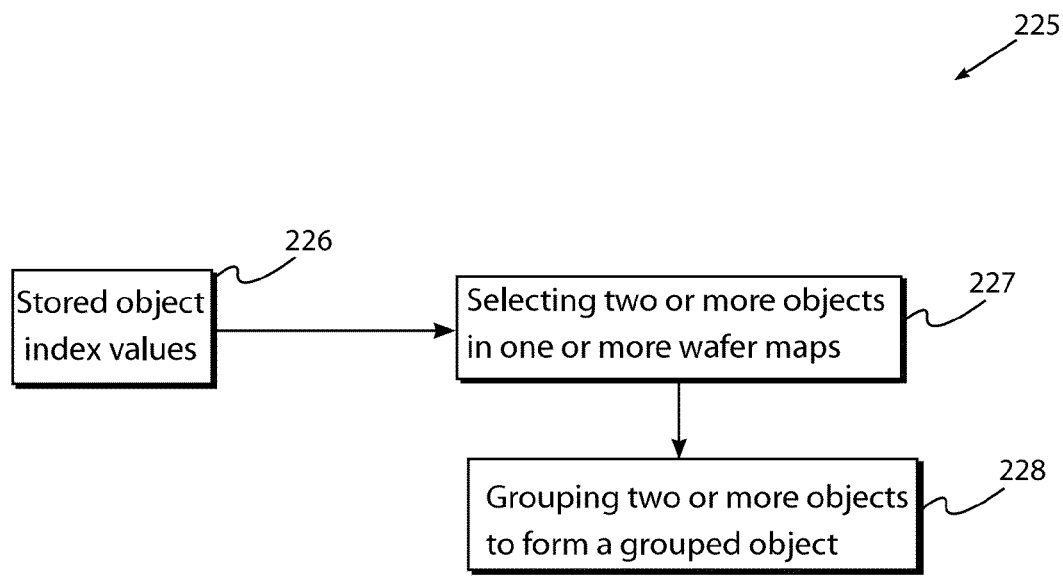
FIG. 2 is a flow chart illustrating the step of selecting an object in a method of automatically detecting failure patterns for a semiconductor wafer fabrication process according to some embodiments.

With reference now to FIG. 2, a step of selecting an object 225 in a method of automatically detecting failure patterns for a semiconductor wafer fabrication process according to some embodiments is provided. At block 227, two or more objects in one or more wafer maps of a plurality of wafer maps can be selected. For example, stored object index values (block 226) may indicate that one object is an independent object and another object is a dependent object such that there is a high probability of both objects being observed on the same wafer map. By way of example, object index values can be stored at block 226 in a histogram format to indicate a relationship between the two or more objects. By way of another example, one object can have a maximum geography area object index value and another object can have a maximum perimeter distance object index value. At block 228, the two or more selected objects can be grouped to form a grouped object. For example, the objects can be merged and grouped to form one object and then processed as an object as described below. In various embodiments, a linear discriminant analysis (LDA) can be performed to eliminate noise during the process of grouping or merging the two or more selected objects.

In some embodiments, a preliminary label and/or a recording label can be assigned to each object in each respective selected wafer map of the plurality of wafer maps. For example, a preliminary numeric label can be assigned to each object in each respective selected wafer map to differentiate the objects during the selection process. In some embodiments, equivalences for the object index values can be determined in a local equivalence table for the objects in each respective selected wafer map of the plurality of wafer maps. In some embodiments, the equivalence classes can be resolved and the respective objects can be relabeled in each respective selected wafer map of the plurality of wafer maps. For example, the object index values for a plurality of objects in a wafer map can be determined. The objects can be preliminarily labeled to identify an object with its associated object index values. Two or more objects can be selected based on their associated object index values and stored object index values. The objects can be grouped, equivalences resolved for the determined object index values for the grouped object and a recording label can be assigned to the respective grouped object.

In various embodiments, one or more wafer map indices can be selected for determining a respective feature in each respective wafer map. As used herein, a wafer map index for determining a respective feature in each respective wafer map is a mechanism for describing the information on the wafer map. In various embodiments, the selected one or more object indices are insufficient to describe the information on the wafer map for feature determination. For example, a wafer map index may be a transformation function applied to the failure data on the wafer map. By way of example, a wafer map index may include, but is not limited to, a Radon transform, a Fourier transform, a Hough transform, a random transform, etc. A plurality of wafer map index values can be determined in each respective wafer map using each respective selected one or more wafer map indices.

In some embodiments, a Radon transform can be selected as a wafer map index. A plurality of wafer map index values (e.g. s and $\alpha$ where s represents a distance along any straight line L and $\alpha$ represents an angle that a straight line L makes with an axis) can be determined in each respective wafer map such that the radon transform function returns a radon transform R of an intensity image of the wafer map for each angle $\alpha$ from a fixed point (e.g. center of the wafer map) in the wafer map. In various embodiments, determining a plurality of wafer map index values can include determining a matrix of wafer map index values and a projection of the wafer map index values. For example, determining a plurality of wafer map index values using a Radon transform wafer map index can involve computing a matrix in which each column is the Radon transform for one of the angles $\alpha$ from a fixed point (e.g. center of the wafer map) and computing an x-y projection where the y-axis represents the distance (s) of the projection and relative to the fixed point and the x-axis represents the angle $\alpha$ from 0 to 179 degrees.

At block 130, a respective feature in each of the respective selected wafer maps is determined using the determined first plurality of object index values for the respective selected object and stored feature information. In various embodiments, feature information stored in a database at block 131 can include previously calculated object index values determined using previously selected object indices in previously selected wafer maps. In some embodiments, feature information stored in a database at block 131 can include object index values object stored in a histogram format to indicate a relationship between two or more objects. In some embodiments, feature information stored in a database can include previously calculated object index values for grouped objects in a previously selected wafer map. In some embodiments, the stored feature information can include feature points previously determined for previous objects using previously selected object indices in previously selected wafer maps and previously stored feature information.

For example, the geography length and geography area can be selected as object indices in a respective wafer map. A plurality of object index values can be calculated for a plurality of objects in each respective selected wafer map. Also, an object can be selected from the respective wafer map based on the determined plurality of object index values. In various embodiments, the object index values for the selected object can be combined (e.g. by plotting on a 2-D graph) to form a feature point. Then, the selected object can be compared with feature points stored in the feature database. The feature database stores feature points with the same selected object indices of each previously processed wafer. On the other hand, in various embodiments, a respective feature can be determined by using a predefined plurality of wafer map index values in each selected wafer map. By way of example, a Radon transform function can be selected as a wafer map index. Then, the Radon transform function can be used as a plurality of wafer map index values for each respective selected wafer map. A feature point can be extracted for a respective wafer map by selecting the maximum value of a Radon transform projection for the selected wafer map. In addition, a feature point can be extracted from a respective wafer map by averaging the projection matrix of the Random transform. After performing the average operation on the projection matrix, then the more discriminating power 1-dimensional data can be derived. This 1-dimensional data can be seen as a data distribution of the selected wafer map. This feature also can be compared with other feature points in the feature database.

Further by way of example, geography area, geography length and perimeter distance can be selected as object indices for a respective wafer map and a plurality of object index values can be calculated for a plurality of objects in each respective wafer map to select one or more objects in each respective selected wafer map. The resultant object index values for the respective selected one or more objects can be combined (e.g. by plotting on a 3-D graph) to form a feature point and compared with feature points stored in a database for previous features of previously processed wafer maps formed using the same object indices. The feature point can be compared with a library of known feature points to match the feature point. In this manner, the quality of the determined feature can be quantified, and irrelevant features can be quickly eliminated. A respective determined feature for a respective wafer map can include, but is not limited, to an upwardly curving semicircular feature (e.g. smile-shaped feature), a downwardly curving semicircular feature (e.g. frown shaped feature), a laterally curving semicircular feature, an elongated substantially linear feature emanating from the center of the wafer map, a circle of N units in diameter positioned substantially about the center of the wafer map, a triangle of N area units positioned in an upper left quadrant of the wafer map, etc.

Any suitable feature discrimination algorithm commonly used in the art to extract features in image processing can be utilized, or alternatively, future developed feature discrimination algorithms can also be utilized. For example, degrees of correlation can be measured between the determined feature point and previously stored feature points to extract the respective feature in the respective wafer map by selecting the feature point that has the highest degree of correlation. In some embodiments, a covariance matrix based distance (e.g. diagonal covariance matrix based distance) can be determined for the feature data. In various embodiments, a linear discriminant analysis (LDA) can be performed for the feature data. Ranges for degrees of correlation can be selected based on, for example, the feature discrimination algorithm selected for feature determination and/or based on the amount of failure data in the respective selected wafer map and/or the amount of failure data for a selected object in a respective selected wafer map. For example, a degree of correlation between approximately 70% and 100% (i.e. between 69.5% and 99.5%) between the determined feature point and a previously stored feature point can be used for feature discrimination. In some embodiments, a degree of correlation range between approximately 80% and 100% (i.e. between 79.5% and 99.5%) between the determined feature point and a previously stored feature point can be selected. In other embodiments, fuzzy matching can be used and/or fuzzy membership degrees can be assigned to calculate the highest degree of correlation and determine the respective feature. For example, a fuzzy matching algorithm can be used to compute and assign probabilities of belonging to a certain feature to the newly determined feature point.

At block 140, a respective pattern for each of the respective selected wafer maps is classified using the respective determined feature and a plurality of stored pattern information at block 161. A pattern represents the one or more features on a respective wafer map, determined using the plurality of object index values and/or wafer map index values for the wafer map, and including the associated feature information, object index information and/or wafer map index information, attribute information, object information and image information on the wafer map (e.g. pixel information). Stored pattern information can include pattern definitions and pattern templates. Pattern definitions can include feature information, object index information and/or wafer map index information, attribute information, object information and image information on the wafer map (e.g. pixel information, angle information) for respective patterns. Pattern templates can include a general format for pattern information in a pattern (e.g. hierarchical relationship between feature information, attribute information, object information and image information). In various embodiments, a k-nearest neighbor algorithm is used to classify the respective pattern for each of the respective selected wafer maps using the respective determined feature and a plurality of stored pattern information. Thus, a respective pattern is classified by a majority vote amongst its k nearest neighbors. The choice of k can be a trade-off between the variability and susceptibility to noise associated with a low value of k against the over-smoothing associated with a high value of k. In some embodiments, k can be determined by heuristic techniques commonly used in the art or alternatively by future developed techniques that depend on the type of wafer map being processed, and/or the number of defect data points being processed.

By way of example, a respective pattern for a respective selected wafer map can be classified using the formula $\Sigma_{i,j \in Ni} d(x_i, x_j)$ where $d(x_i, x_j) = (x_i - x_j) M (x_i - x_j)$, M is the identity matrix, that for an unknown wafer map classification point $(x_i, y_i)$ and N representing k, a distance (e.g. Euclidean or Mahalanobis distance) can be measured between the unknown wafer map classification point's independent variable value $(x_i)$, the unknown wafer map classification point's dependent variable value $(y_i)$, and k stored classification points $(x_j, y_j)$ for previously stored patterns. In some embodiments, $(x_i, y_i)$ can be a feature point for the determined feature for a respective wafer map. In other embodiments, $(x_i, y_i)$ is determined based on two or more feature points for a respective wafer map. For example, two or more feature points for a respective wafer map can be combined (e.g. by plotting on a 2-D or 3-D graph) to form a classification point and compared with classification points stored in a database 136 for classified patterns of previously processed wafer maps formed using the same two or more features. In various embodiments, classification points can be stored at block 136 for classified patterns including, but not limited to, localized patterns, sector patterns, center patterns, scratch patterns, edge patterns, ring patterns, radiation patterns, donut patterns or top/bottom patterns.

Figure 6:
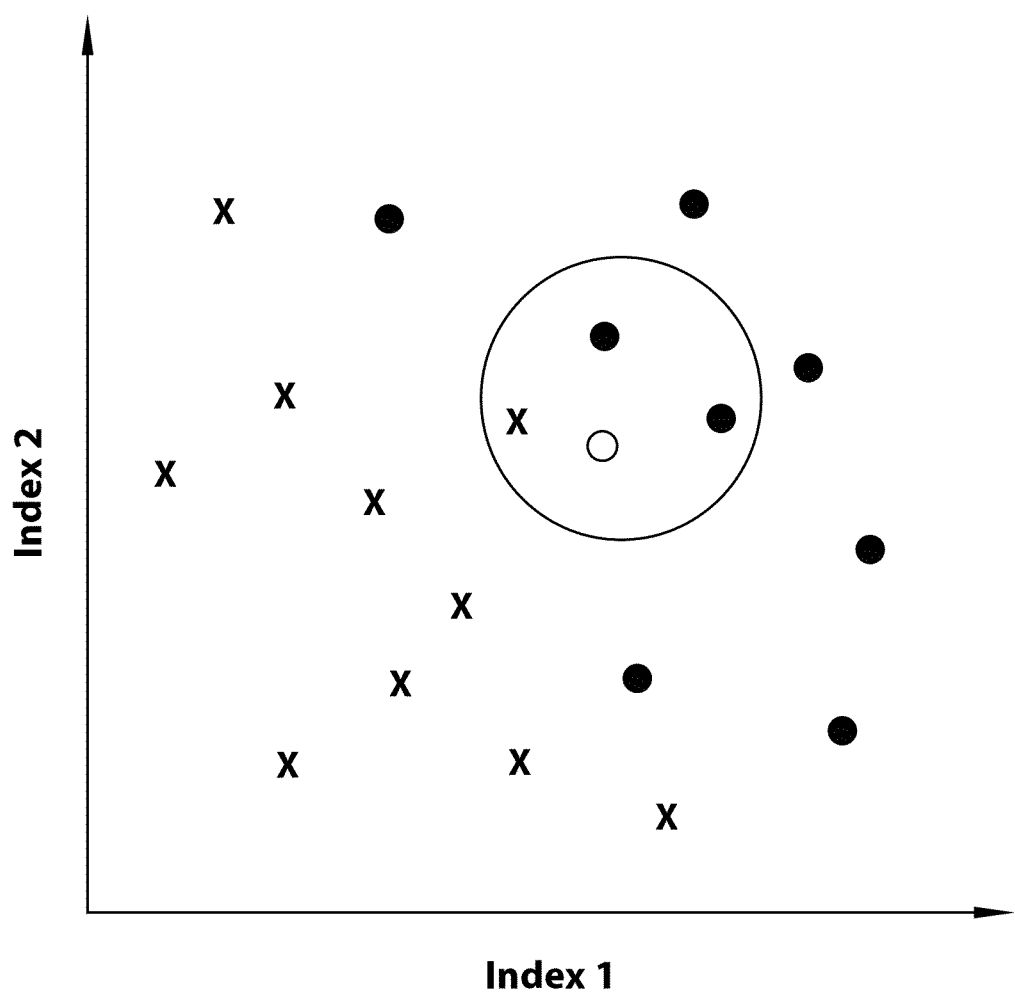
FIG. 6 is a diagram showing a step of pattern determination according to embodiments of the present disclosure.

For example, and with reference now to FIG. 6, k can be selected to equal 3 for classifying a respective pattern for each of a plurality of respective selected wafer maps. As described above, a respective wafer map can be determined to include respective feature 1 and respective feature 2 for a respective wafer map. The respective wafer map can be determined to include a classification point ($x_i$=determined feature 1 point value, $y_i$=determined feature 2 point value). In various embodiments, a respective wafer map can be determined to include one respective feature and a classification point (($x_i$=determined object index 1 point value, $y_i$=determined object index 2 point value). The respective wafer map's respective pattern can be classified using a k nearest neighbor algorithm (k=3), its respective classification point and by majority voting among the classification points of two or more of a plurality of stored classified patterns ($x_i$=stored feature 1 point value, $y_i$=stored feature 2 point value) such as for example, center patterns and localized patterns. In the illustrated example, using a 3-nearest neighbor algorithm, the respective pattern for the respective wafer map is classified as a localized pattern. Once a respective pattern for a respective wafer map is classified as described herein, the failure and/or defect type of the input wafer can be established. In various embodiments, the pattern information for each of the respective selected wafers is stored in pattern database 136. In some embodiments, the classified patterns are used to adjust one or more parameters of the semiconductor fabrication process.

At block 140, a respective wafer fingerprint for each of the respective selected wafer maps is formed using the respective classified pattern and the plurality of stored patterns. In various embodiments, each respective classified pattern represents a respective wafer fingerprint, corresponding to a classified failure type, and having its respective determined feature information, object index information and/or wafer map index information, attribute information, object information and image information. In various embodiments, each respective wafer fingerprint is stored in a database. For example, each respective wafer fingerprint can be stored in a wafer fingerprint library.

In various embodiments, the plurality of respective classified patterns can be ranked using a clustering algorithm with stored patterns of substantially similar classification (e.g. localized, sector, center, scratch, edge, ring, radiation, donut or top/bottom.) In various embodiments, a hierarchical clustering method can be used to form a respective wafer fingerprint for each of the respective selected wafer maps. For example, a respective wafer fingerprint can be formed for each of the respective selected wafer maps using the formula $D_{max}(C_i, C_j)$=max d(a,b) where a∈Ci, b∈Cj where d represents a distance (e.g. Euclidean distance) between i and j, two points in pattern clusters $C_i$ and $C_j$ and $D_{max}$ represents the cluster distance. In this algorithm, the distance of the farthest points of the two clusters can be compared. In other embodiments, a respective wafer fingerprint can be formed for each of the respective selected wafer maps using the formula $D_{min}$ ($C_i$, $C_j$)=min d(a,b) where a∈Ci, b∈Cj where d again represents a distance (e.g. Euclidean distance) between i and j, two points in pattern clusters $C_i$ and $C_j$ and $D_{min}$ represents the cluster distance. In this algorithm, the distance of the closest points of the two clusters can be compared. If the computed cluster distance in either algorithm is below a certain predetermined threshold, then the two clusters are completely merged. In various embodiments, an average value is determined in each pattern cluster $C_i$ and $C_j$ and the average value represents the cluster centroid. In various embodiments, the cluster distance (d) is computed between the cluster centroids of pattern clusters $C_i$ and $C_j$.

Each of the newly classified patterns and each of the stored patterns can be individually assigned to their own pattern cluster. The closest (most similar, e.g. closest distance) pair of pattern clusters are merged into a single pattern cluster, so that one less pattern cluster exists. The distances between the new cluster and each of the remaining pattern clusters is computed and the two closest (most similar) pattern clusters are again merged into a single pattern cluster, The algorithm can then iterate until no more merging occurs, at which point all pattern clusters are formed. The pattern information of the formed pattern clusters represent new wafer failure patterns. A wafer fingerprint is thus formed that represents the new wafer failure pattern. The wafer fingerprint can be stored in a database such as, for example, a wafer fingerprint library.

At block 145, the respective wafer fingerprints are used to adjust one or more parameters of the semiconductor fabrication process. For example, the one or more parameters can include active process parameters, passive process parameters, design parameters, layout parameters, or combinations thereof. Further, by way of example, an active (or actively controlled) process parameter can include any process parameter that can be easily specified during a particular semiconductor process (such as, by defining the parameter in an equipment recipe.) Examples of an active parameter include an RF power, a gas flow rate, a concentration, a trim time, a pressure, or a processing time. A passive parameter can include any fabrication process parameter that is not determined by recipe but rather, for example, is a dependent variable inherent in a process based upon other passive and/or actively controlled parameters, a type of equipment, a condition of equipment, a condition of a wafer being processed, and/or other possible factors. Examples of a passive process parameter include reflected power, ambient conditions, contaminate levels, and temperature and/or pressure profiles inherent in a fabrication tool. Further examples include critical dimension (CD) or depth for a poly etching process. In various embodiments, a respective classified pattern, and its associated wafer fingerprint, can be used in identifying a process within a tool that caused the indicated failure type. For example, a respective classified pattern may indicate a problem with a deposition process, or a chemical dispensing process, or a wafer handling or transfer process, or a problem with a photo-lithography tool. The inventors have determined that the use of the determined wafer fingerprints can significantly reduce this analysis and identification time and thus significantly improve yield. A process parameter associated with an identified problem, for example with a wafer handling or transfer process, can be adjusted accordingly. In various embodiments, a plurality of semiconductor wafers are fabricated in a wafer fabrication process incorporating the adjusted process parameter.

Figure 3D:
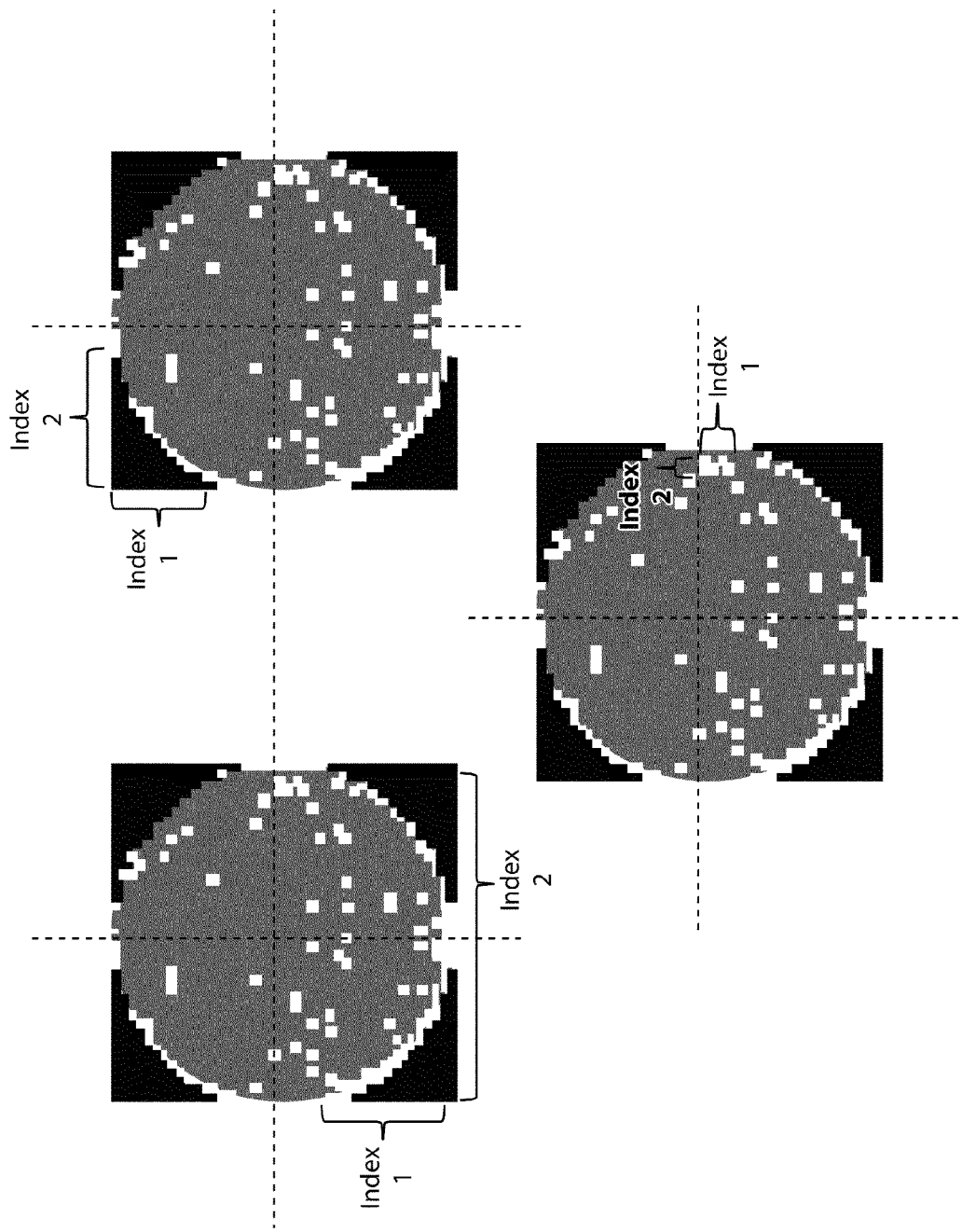

FIGS. 3A-3D illustrate simplified diagrams of examples of wafer maps according to various embodiments of the present disclosure. With reference now to FIG. 3A, a plurality of wafer maps are formed based on a test data set collected from testing a plurality of semiconductor wafers as described above for blocks 102-106 for method 100. As illustrated in FIG. 3B, a determination is made as to whether each respective wafer map includes one or more respective objects as described above at block 110. On the left of the dashed line, four simplified diagrams of examples of wafer maps are depicted, each including one or more respective objects. On the right of the dashed line, three simplified diagrams of examples of wafer maps are depicted, where each wafer map does not include one or more respective objects. With reference now to FIG. 3C, one of the three simplified diagrams of wafer maps of FIG. 3B is shown. In the illustrated embodiment, the respective example of a wafer map is determined to include three objects (310, 320, 330). In various embodiments, as described above, the respective example of a wafer map can be segmented by selected objects where each selected object in the wafer map is individually processed as described above. As shown, the respective wafer map having three selected objects can be split into three sub-wafer maps, each containing a subset of the failure data for a particular wafer map.

FIG. 3D shows the three simplified diagrams of examples of sub-wafer maps of FIG. 3C are shown. As described above for block 115, two or more object indices in each of the sub-wafer maps can be selected. As shown in the example illustrated on the left side of FIG. 3D, an index 1 of geography width and an index 2 of geography length can be selected and a plurality of object index values for the objects illustrated in the sub-wafer map depicted therein can be determined. As shown in the center example of FIG. 3D, a plurality of object index values can be determined using selected object indices 1 and 2 for the objects illustrated in the sub-wafer map depicted therein. In some embodiments, the selected object indices can differ for each sub-wafer map. As shown in FIG. 3D, the object indices can be identical for each sub-wafer map. As shown in the sub-wafer map illustrated on the right side of FIG. 3D, a plurality of object index values can be determined using selected object indices 1 and 2 for the objects illustrated therein.

Figure 3E:
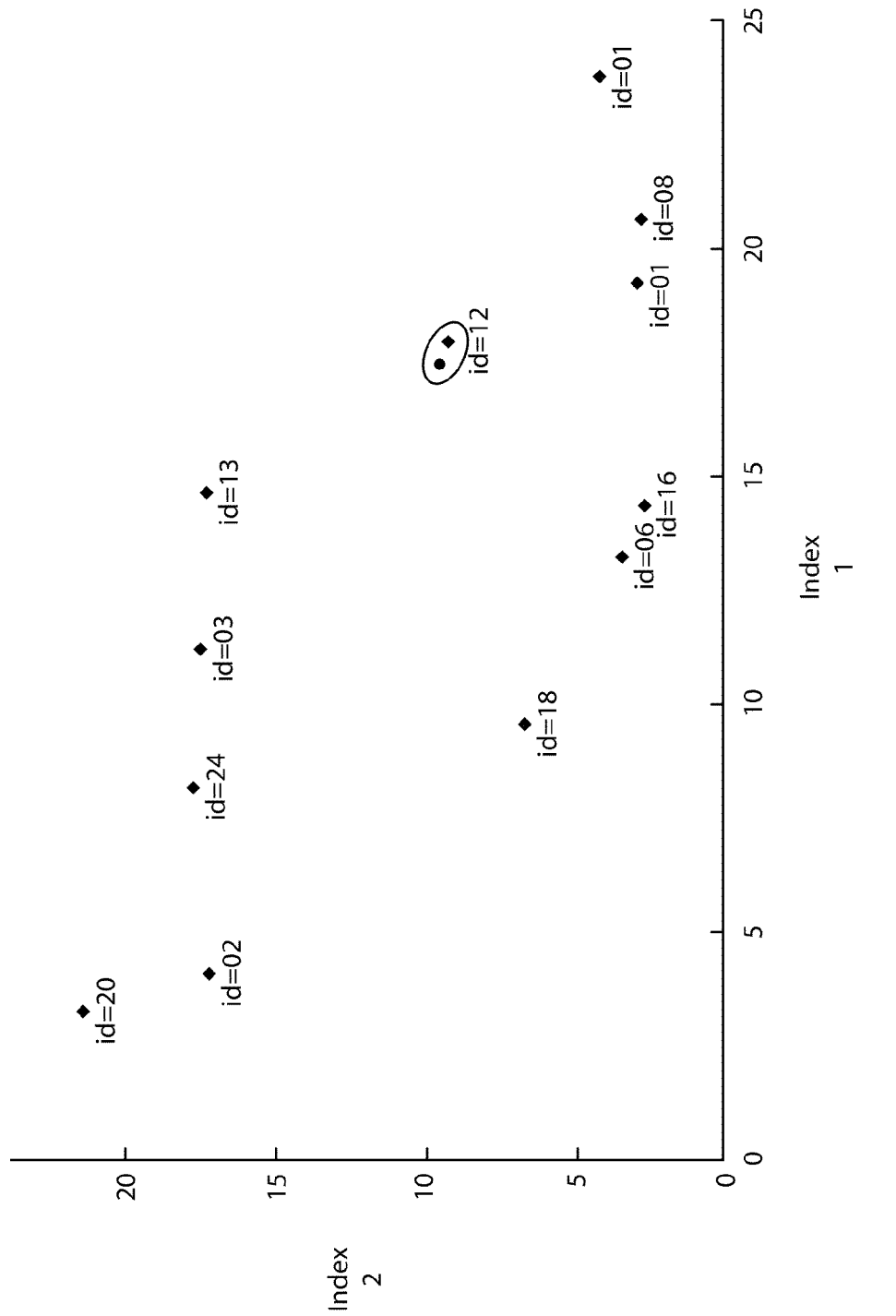
FIGS. 3E and 3F illustrate two diagrams showing a step of feature determination using a pair of object indices and stored feature information according to embodiments of the present disclosure.
Figure 3F:
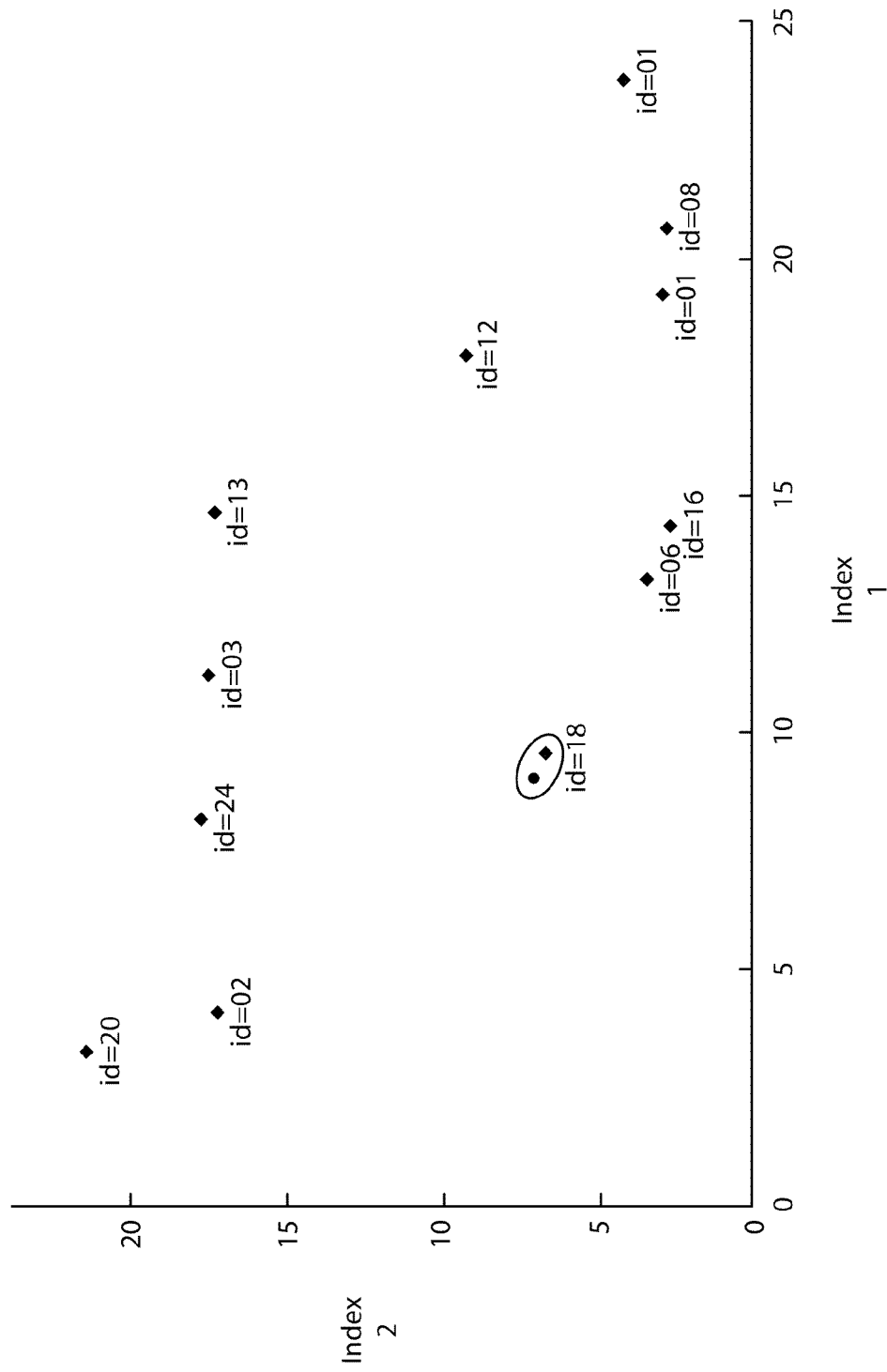

FIGS. 3E and 3F illustrate diagrams showing examples of a step of feature determination using a pair of object indices and stored feature information according to embodiments of the present disclosure. As described above for block 135 and illustrated in FIGS. 3E and 3F, the resultant plurality of object index values for the selected objects in the respective sub-wafer maps can be calculated and combined (e.g. by plotting on a 2-D graph) to form a feature point and compared with feature points stored in a database for previous features of previously processed wafer maps formed using the same respective object indices. In various embodiments (not shown), three object indices can be used for the step of feature determination. In some embodiments (not shown), one or more wafer map indices can be used for the step of feature determination.

Figure 4A:
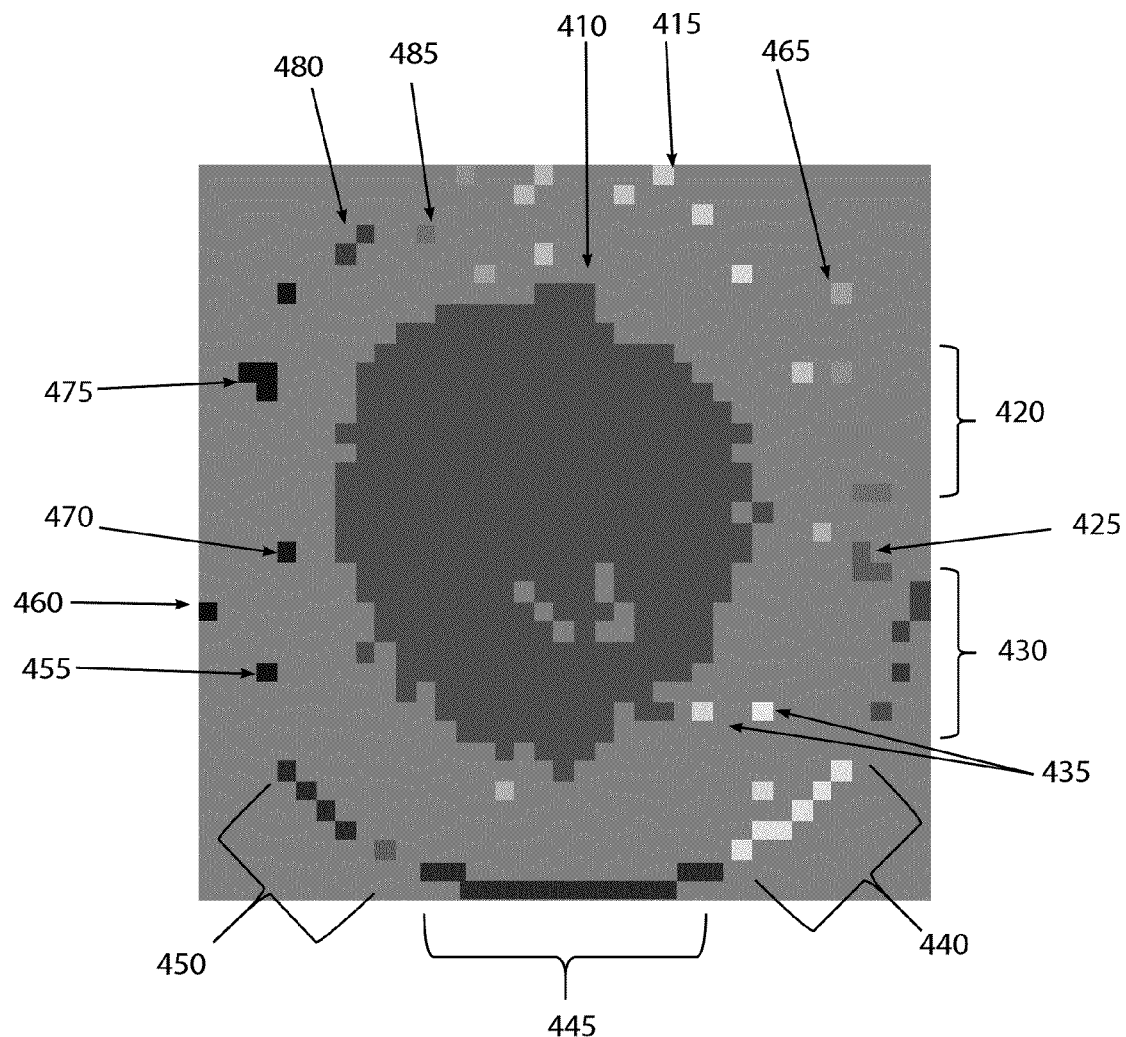
FIG. 4A is a simplified diagram of a wafer map according to various embodiments.

Referring now to FIG. 4A, a simplified diagram of a wafer map 400 according to various embodiments is provided. As described above at block 110, wafer map 400 is determined to comprise one or more respective objects (410, 415, 420, 425, 430, 435, 440, 445, 450, 455, 460, 470, 475, 480, 485). One or more object indices can be selected to select a respective object (410, 415, 420, 425, 430, 435, 440, 445, 450, 455, 460, 470, 475, 480, 485) in the respective selected wafer map 400. In the illustrated embodiment, the selected object indices are geography area and perimeter distance. Referring now to FIG. 4B, a simplified chart of determined plurality of object index values for each of the respective objects (410, 415, 420, 425, 430, 435, 440, 445, 450, 455, 460, 470, 475, 480, 485) in the respective selected wafer map 400 is shown. In the example illustrated in FIG. 4B, the resultant values of geography area (index 1) and perimeter distance (index 2) are shown in a tabular format. Object 410 has the largest geography area and perimeter distance. In various embodiment, object 410 is selected based on the determined plurality of object index values shown in FIG. 4B. FIG. 4C illustrates a diagram showing a step of feature determination using object index values for object 410 and stored feature information. The resultant determined object index values for geography area and perimeter distance for selected object 410 can be combined (e.g. by plotting on a 2-D graph) to form a feature point and can then be compared with feature points stored in a database for previous features of previously processed wafer maps formed using the same respective object indices (geography area and perimeter distance). FIG. 4C shows that a feature of wafer map 400 is determined using the feature point of object 410 and stored feature information.

Figure 5:
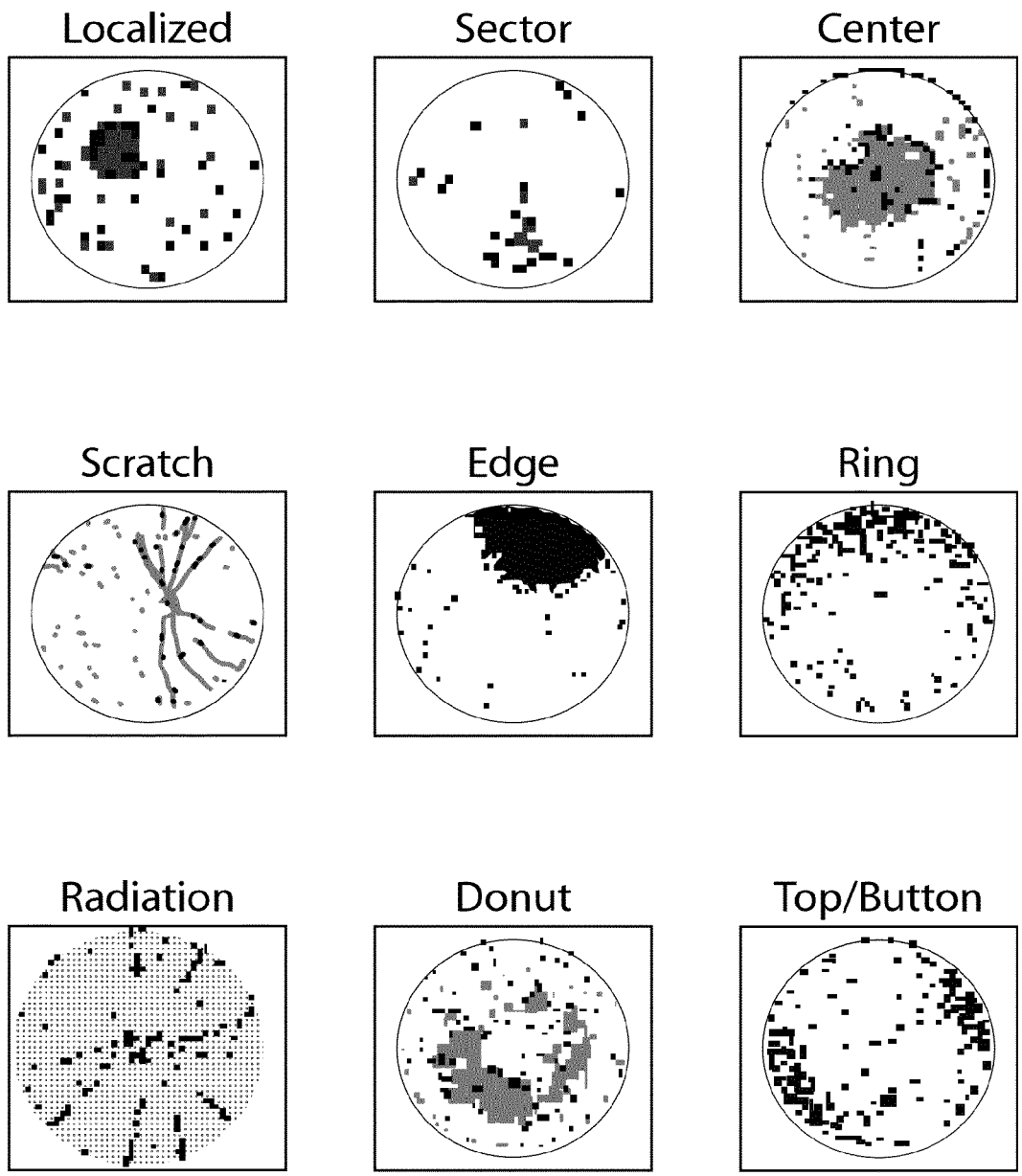
FIG. 5 are simplified diagrams showing stored pattern information according to some embodiments.

FIG. 5 are simplified diagrams showing stored classified pattern information for various pattern templates according to some embodiments. As described above at block 136, a plurality of classified patterns and pattern information are stored to permit classification of respective patterns for respective selected wafer maps using a respective feature determined therein. As described above and as illustrated in FIG. 4, classification points and other pattern information can be stored at block 136 for classified patterns including, but not limited to, localized patterns, sector patterns, center patterns, scratch patterns, edge patterns, ring patterns, radiation patterns, donut patterns or top/bottom patterns. FIG. 5 illustrates examples of stored pattern templates and pattern definitions generally used to classify respective patterns for respective selected wafer maps using the respective feature determined therein.

Figure 7:
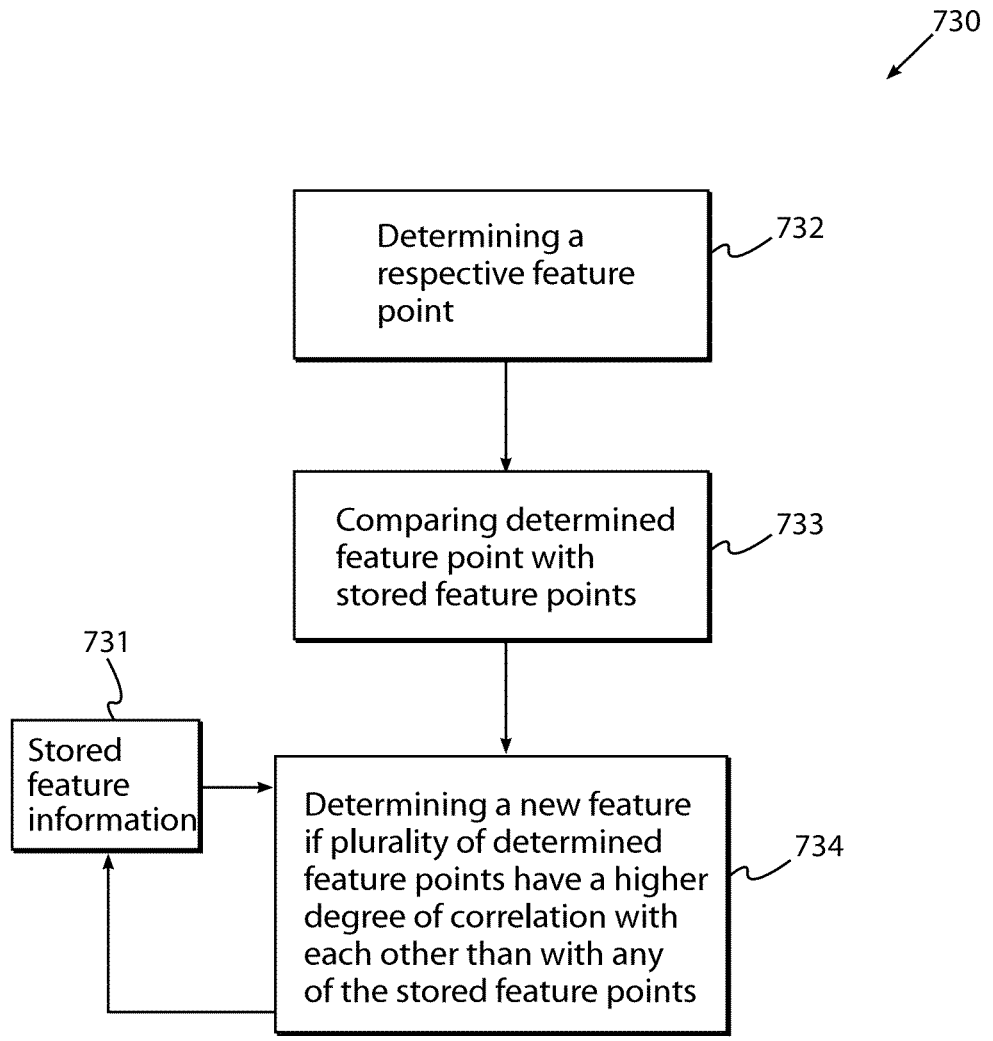
FIG. 7 is a flow chart illustrating a step of feature determination using a pair of object indices and stored feature information according to embodiments of the present disclosure.

Referring now to FIG. 7, a flow chart illustrating a step of feature determination 730 using a pair of object indices and stored feature information for a plurality of stored patterns according to various embodiments is provided. The same one or more object indices for selecting an object in two or more of the plurality of wafer maps can be selected and an object is selected in the two or more of the plurality of selected wafer maps as described above. At block 732, a respective feature point is determined using the object index values determined for the selected object in each respective wafer map. At block 732, a comparison is made between the stored feature information and the respective determined feature point in each of the respective selected wafer maps. By way of example, a feature point can be determined in each of the respective selected wafer maps and compared to stored feature points. If a plurality of determined feature points have a higher degree of correlation with each other than with any of the plurality of stored feature points, than a new feature is determined in the respective selected wafer maps having the plurality of determined feature points. The information associated with the determined new feature, including, for example, the new feature point, can be stored in a database or library with other previously stored feature information.

Figure 8:
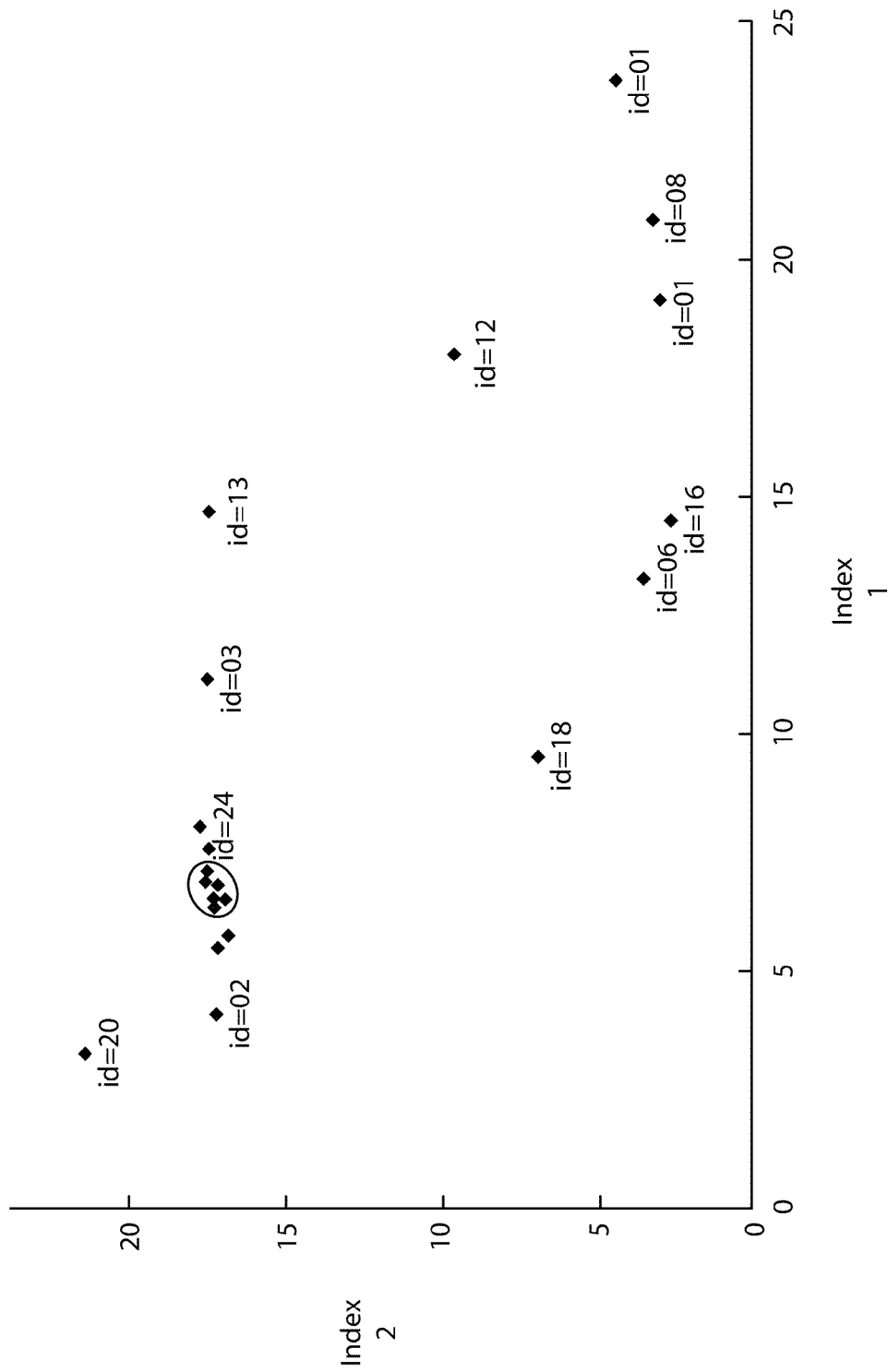
FIG. 8 is a diagram showing a step of new feature determination using a pair of object indices and stored feature information according to embodiments of the present disclosure.

FIG. 8 illustrates a diagram showing a step of new feature determination using a pair of object indices and stored feature information according to an example. The same object indices (Index 1 and Index 2) are selected in two or more of the plurality of wafer maps and were previously selected in prior wafer maps containing the stored feature information (block 731). As illustrated, a new feature point corresponding to a new feature can be determined if the determined feature points have a higher degree of correlation with each other than with any of the plurality of stored feature points for a plurality of stored patterns. This method permits determining degrees of similarity between selected wafer maps using determined and stored feature information. In various embodiments, a new feature can be determined using stored feature information (e.g. feature points) and determined feature information (e.g. feature points) by determining a degree of correlation between them.

Figure 9:
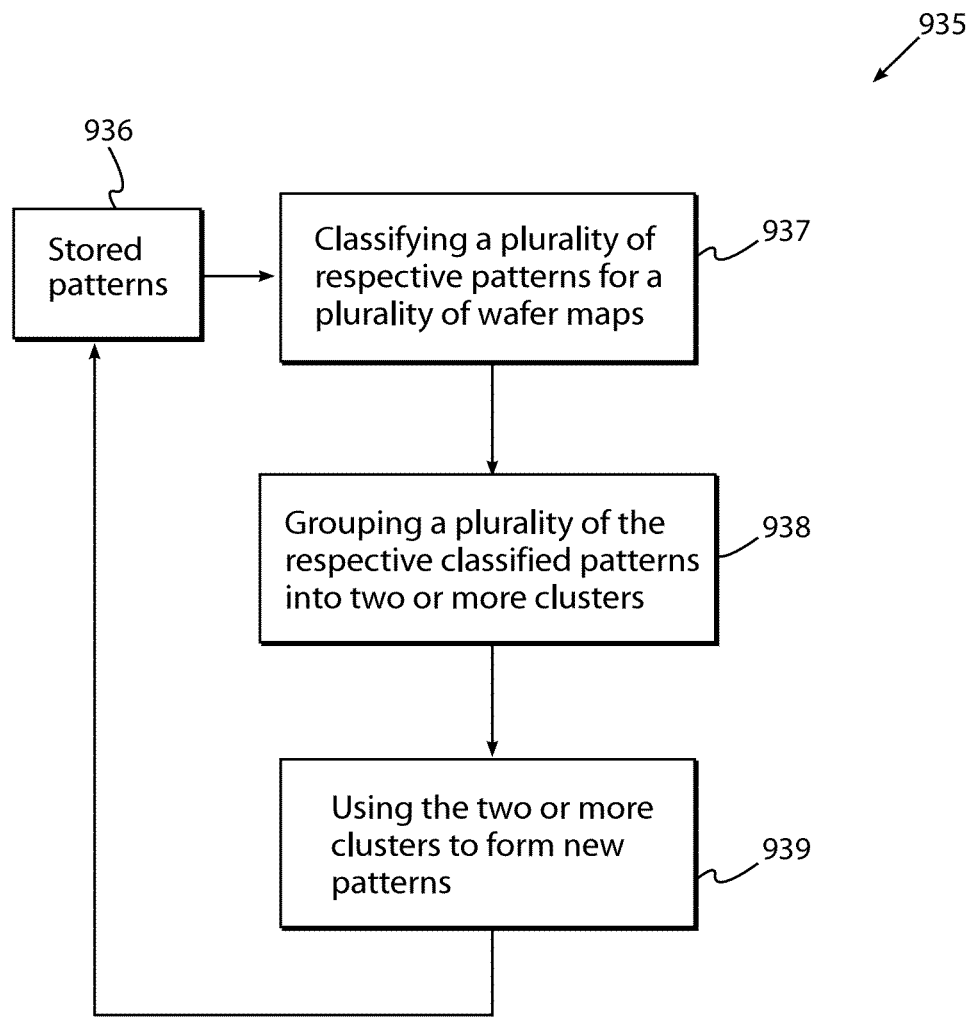
FIG. 9 is a flow chart illustrating a method of automatically detecting failure patterns for a semiconductor wafer fabrication process according to some embodiments.

Referring now to FIG. 9, a flow chart illustrating a step of new pattern determination of a method of automatically detecting failure patterns for a semiconductor wafer fabrication process according to some embodiments is provided. One or more respective features in a plurality of wafer maps is determined as described above. At block 937, a plurality of respective patterns for the plurality of wafer maps are classified as described above for block 135 using stored pattern information at block 936. At block 938, a plurality of the respective classified patterns are grouped into two or more pattern clusters. In various embodiments, a hierarchical clustering method or agglomerative clustering method can be used to merge the two or more pattern clusters into a single pattern cluster as described above. At block 939, the two or more clusters are used in connection with a clustering algorithm to form new patterns and pattern information for storing in a library or database.

In some embodiments, various steps of the method can be implemented by a general purpose computer programmed in accordance with the principals discussed herein. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Figure 10:
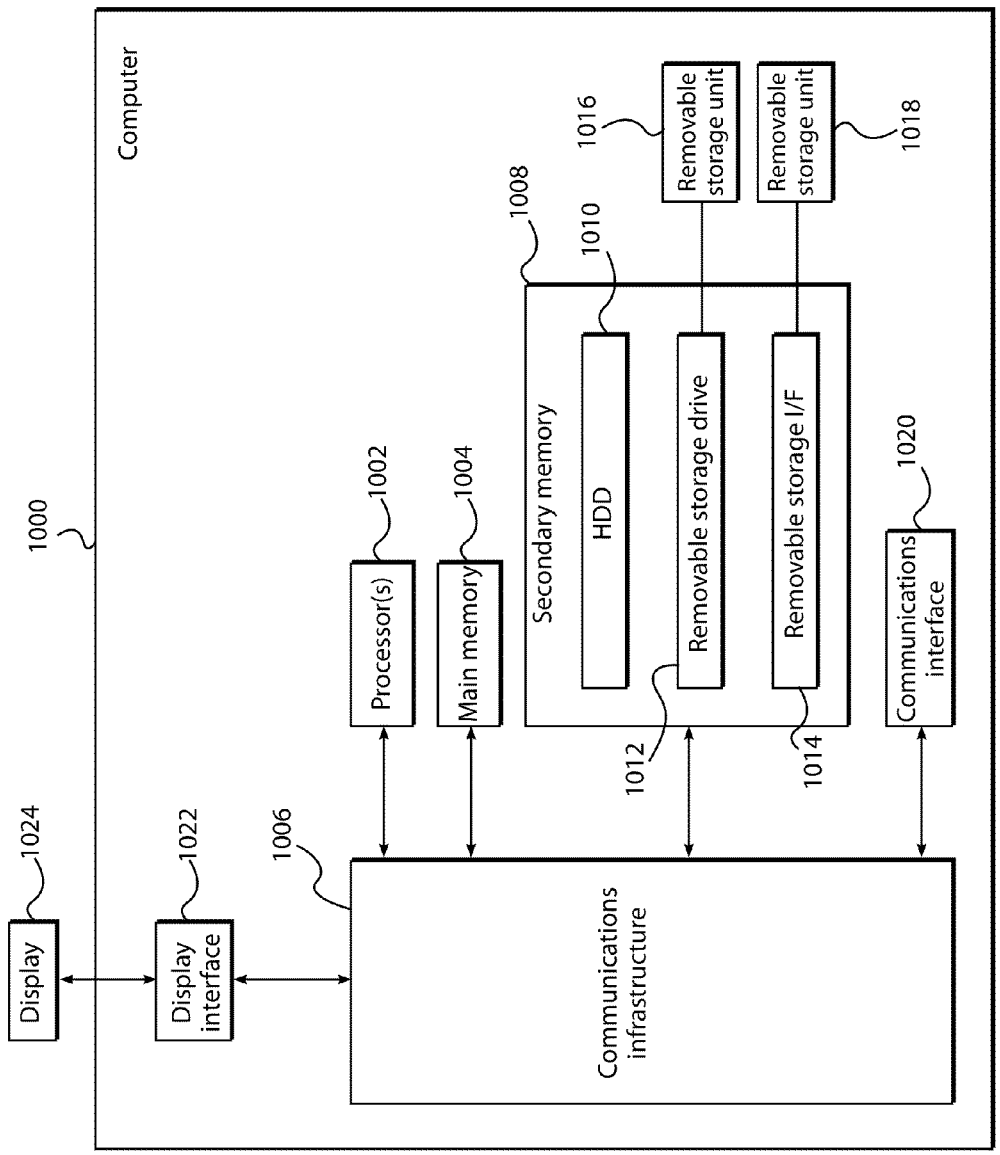
FIG. 10 is a diagram of an illustrative example of an architecture of a computer processing unit according to some embodiments.

A diagram of an illustrative example of an architecture of a computer processing unit according to some embodiments is shown in FIG. 10. Embodiments of the subject matter and the functional operations for various steps of processes described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a tangible machine readable storage medium for execution by, or to control the operation of, data processing apparatus. The tangible storage medium can be a computer readable medium. The computer readable medium can be a machine-readable storage device, a machine-readable storage substrate, a memory device, a hard disk drive, a tape drive, an optical drive (such as, but not limited to CDROM, DVD, or BDROM) or the like, or a combination of one or more of them.

At least a portion of the system and method for automatically detecting failure patterns for a semiconductor wafer fabrication process described herein can be implemented in computer processing unit 1000 and specifically in software and where results (e.g. indices, feature information, attributes, pattern information), and/or system parameters can be presented to system operator on a graphical user interface (GUI) on a display device such as a computer monitor 1024 (1026) or other display device. Embodiments of the subject matter described in this specification can be implemented on a computer 1000 having a keyboard, pointing device, e.g., a mouse or a trackball, by which the operator can provide input to the computer. Other kinds of devices can be used to provide for interaction with an operator as well; for example, input from the operator can be received in any form, including acoustic, speech, or tactile input. In various embodiments, the computer system 1000 includes functionality providing for various components of the systems for automatically detecting failure patterns for a semiconductor wafer fabrication process and steps of the corresponding methods as described, for example, in FIGS. 1-9.

As illustrated in FIG. 10, computer processing unit 1000 can include one or more processors 1002. The processor 1002 is connected to a communication infrastructure 1006 (e.g., a communications bus, cross-over bar, or network). Computer processing unit 1000 can include a display interface 1022 that forwards graphics, text, and other data from the communication infrastructure 1006 (or from a frame buffer not shown) for display on the display unit 1024. Computer processing unit 1000 can include a warning indication interface (not shown) that forwards warning indicators and other data from the communication infrastructure 1006 (or from a frame buffer not shown) to a warning indicator (not shown).

Computer processing unit 1000 can also include a main memory 1004, such as a random access memory (RAM), and a secondary memory 1008. The secondary memory 1008 can include, for example, a hard disk drive (HDD) 1010 and/or removable storage drive 1012, which can represent a floppy disk drive, a magnetic tape drive, an optical disk drive, or the like. The removable storage drive 1012 reads from and/or writes to a removable storage unit 1016. Removable storage unit 1016 can be a floppy disk, magnetic tape, optical disk, or the like. As will be understood, the removable storage unit 1016 can include a computer readable storage medium having stored therein computer software and/or data. Computer readable storage media suitable for storing computer program instructions and data include all forms data memory including nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM, DVD-ROM, and BDROM disks. The processor 1002 and the memory 1004 can be supplemented by, or incorporated in, special purpose logic circuitry.

In alternative embodiments, secondary memory 1008 can include other similar devices for allowing computer programs or other instructions to be loaded into computer processing unit 1000. Secondary memory 1008 can include a removable storage unit 1018 and a corresponding interface 1014. Examples of such removable storage units include, but are not limited to, USB or flash drives, which allow software and data to be transferred from the removable storage unit 1018 to computer processing unit 1000.

Computer processing unit 1000 can also include a communications interface 1020. Communications interface 1020 allows software and data to be transferred between computer processing unit 1000 and external devices. Examples of communications interface 1020 can include a modem, Ethernet card, wireless network card, a Personal Computer Memory Card International Association (PCMCIA) slot and card, or the like. Software and data transferred via communications interface 1020 can be in the form of signals, which can be electronic, electromagnetic, optical, or the like that are capable of being received by communications interface 1020. These signals can be provided to communications interface 1020 via a communications path (e.g., channel), which can be implemented using wire, cable, fiber optics, a telephone line, a cellular link, a radio frequency (RF) link and other communication channels.

The computer program products provide software to computer processing unit 1000. Computer programs (also referred to as computer control logic) are stored in main memory 1004 and/or secondary memory 1008. Computer programs can also be received via communications interface 1020. Such computer programs, when executed by a processor, enable the computer system 1000 to perform features of the method discussed herein. For example, main memory 1004, secondary memory 1008, or removable storage units 1016 or 1018 can be encoded with computer program code for performing various steps of the processes described in FIGS. 1-9.

In an embodiment implemented using software, the software can be stored in a computer program product and loaded into computer processing unit 1000 using removable storage drive 1012, hard drive 1010, or communications interface 1020. The software, when executed by a processor 1002, causes the processor 1002 to perform the functions of various steps of the methods described herein. In another embodiment, various steps of the methods can be implemented primarily in hardware using, for example, hardware components such as a digital signal processor comprising application specific integrated circuits (ASICs). In yet another embodiment, the method is implemented using a combination of both hardware and software.

Various embodiments can be implemented in a computing system that includes a back end component, e.g., as a data server, or that includes a middleware component, e.g., an application server, or that includes a front end component, e.g., a computer having a GUI or a Web browser through which an operator can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Figure 11:
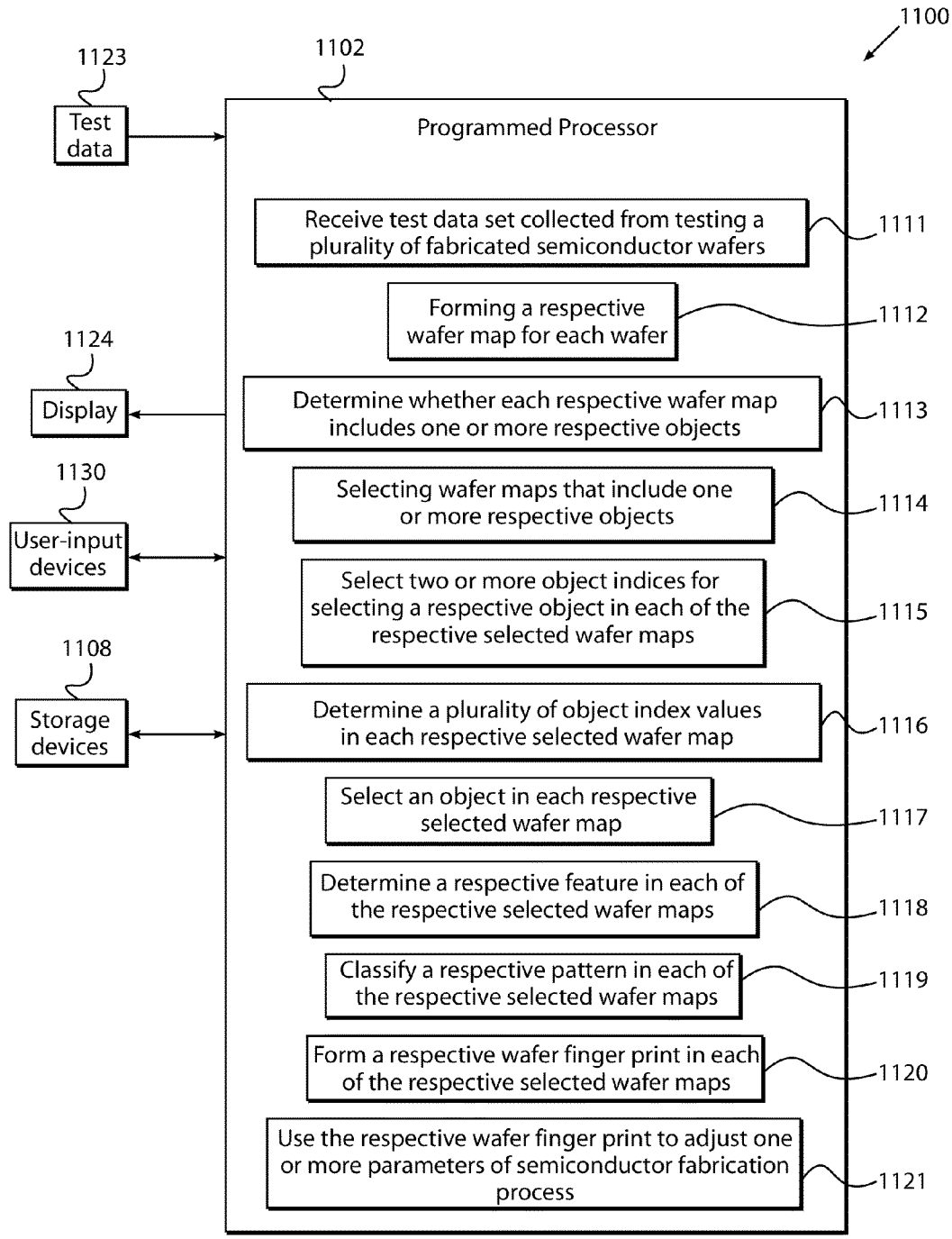
FIG. 11 is a block diagram of a processor system for performing a method described herein.

Many of the steps described above are adapted to be performed using a programmed processor. For example, FIG. 11 shows a processor 1102 programmed to perform the method steps. The steps can be performed by a plurality of separate computer programs, or by a program that prompts the user for additional inputs between and/or during steps. These steps can include one or more of the receiving a test data set collected from testing a plurality of fabricated semiconductor wafers 1111, forming a respective wafer map for each wafer of the plurality of wafers 1112, wafer map object determination 1113, wafer map selection 1114, object index for selecting a respective object selection 1115, object index value determination 1116, object selection 1117; feature determination 1118, pattern classification 1119, wafer fingerprint formation 1120 and interface for wafer fingerprint utilization to adjust one or more parameters of the semiconductor fabrication process 1121. In some embodiments, all numerically intensive calculations are performed by a programmed processor, and the results presented to the user (e.g., engineer) at certain decision points to allow input of engineering judgment. Although FIG. 11 shows a single processor, in other embodiments, various subsets of the processes 1111-1121 can be executed on a plurality of programmed processors, which can optionally be connected to each other by a communications network, such as a personal area network, a local area network, a wide area network, and/or the Internet.

Figure 12:
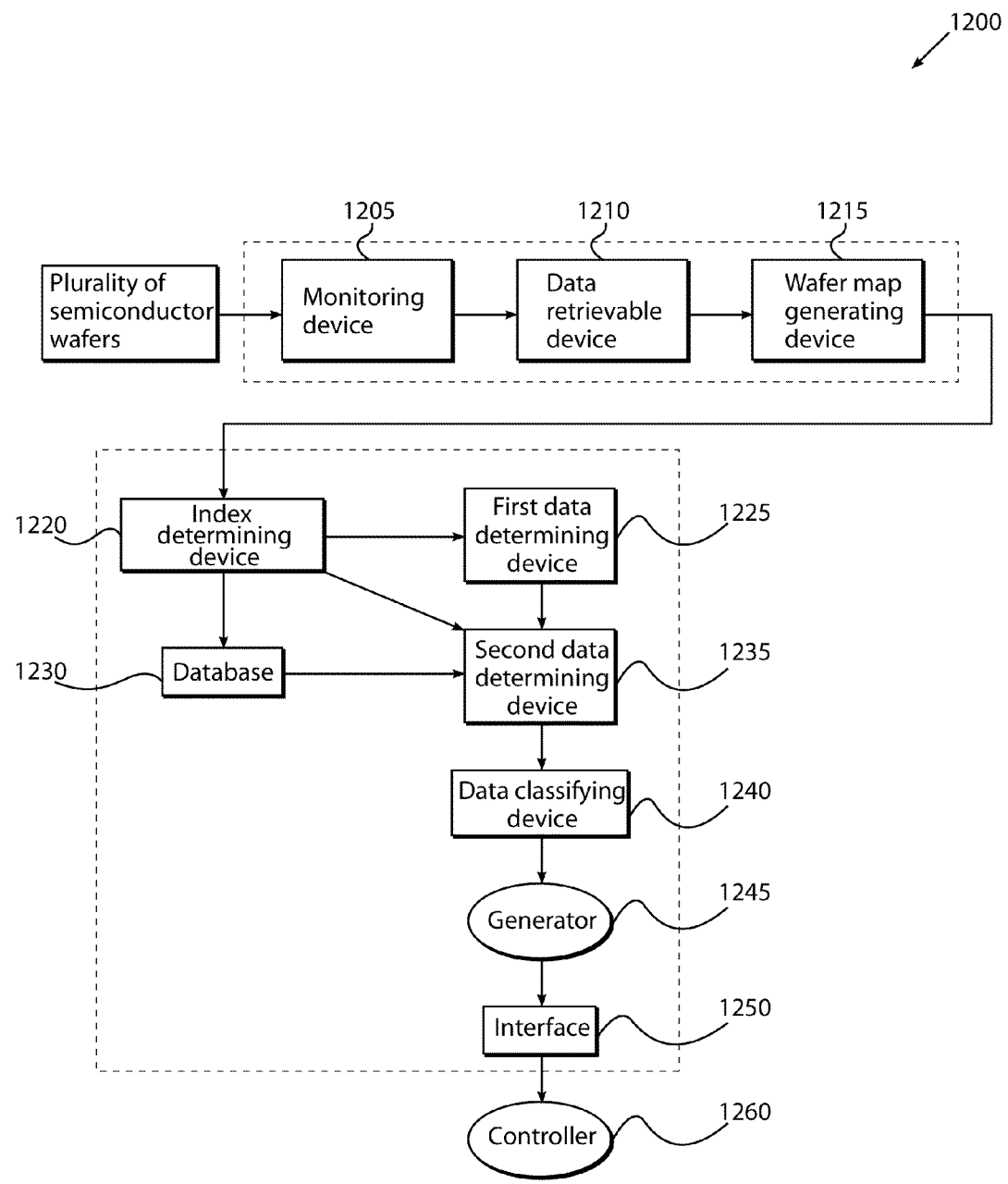
FIG. 12 is an example of a system of automatically detecting failure patterns for a semiconductor wafer fabrication process according to embodiments of the present disclosure.

Referring now to FIG. 12, an example of a system 1200 for automatically detecting failure patterns for a semiconductor wafer process is shown. A monitoring device 1205 is provided to monitor a plurality of semiconductor wafers for failure test data. A data determining device 1210 is shown to retrieve a failure test data set for each semiconductor wafer of the plurality of semiconductor wafers from the monitored failure test data. A wafer map generating device 1215 is shown to form a respective wafer map for each semiconductor wafer of the plurality of semiconductor wafers based on the respective retrieved failure test data set. In some embodiments, one or more of the monitoring device 1205, data determining device 1210 or wafer map generating device 1215 can be provided external to a processor 1100 or other system components for performing one or more of the other steps for automatically detecting failure patterns for a semiconductor wafer process. As shown, a plurality of wafer maps are provided from wafer map generating device 1215 to an index determining device 1220 to determine one or more respective object indices for selecting an object in each of the respective wafer maps. A first data determining device 1225 is included to determine a plurality of object index values in each respective selected wafer map using each of the respective selected one or more object indices received from index determining device 1220. A database 1230 is included to store feature information and pattern information for a plurality of patterns and to provide the stored information to other components of system 1200. A second data determining device 1235 is shown to determine a respective feature in each of the respective wafer maps using a respective selected object in each respective wafer map, the determined plurality of object index values for a respective selected object received from the first data determining device 1225 and stored feature information received from database 1230.

Data classifying device 1240 is provided to classify a respective pattern for each of the respective wafer maps using the respective determined feature received from second data determining device 1235 and the stored pattern information received from database 1230. A generator 1245 is included in system 1200 to generate a respective wafer fingerprint for each of the respective wafer maps using the respective classified pattern received from data classifying device 1240 and the stored pattern information received from database 1230. The illustrated system 1200 also includes an interface 1250 to provide the respective wafer fingerprints to a controller 1260 to adjust one or more parameters of the semiconductor fabrication process. A wafer fabrication device (not shown) can receive an input from controller 1260 to fabricate a plurality of semiconductor wafers using the adjusted one or more parameters of the semiconductor fabrication process. In various embodiments, database 1230 can receive wafer fingerprint information from generator 1245, object index information from first data determining device 1225, feature information from second data determining device 1235, and/or pattern information from data classifying device 1240. In some embodiments, system 1200 can include a comparator (not shown) to compare a respective determined feature point in each respective wafer map with a plurality of stored feature points for a plurality of stored patterns wherein the second data determining device 1235 is further configured to determine the respective feature point in each respective wafer map using the determined plurality of object index values. In some embodiments, the system 1200 can include a third data determining device (not shown) to determine a new feature in one or more of the respective selected wafer maps if a plurality of determined feature points received from the second data determining device 1235 have a higher degree of correlation with each other than with any of the plurality of stored feature points for the plurality of stored patterns received from database 1230. In some embodiments, database 1230 can store information associated with the determined new feature. In other embodiments, a separate database (not shown) can store information associated with the determined new feature.

One embodiment provides a method of automatically detecting failure patterns for a semiconductor wafer process. The method includes receiving a test data set collected from testing a plurality of semiconductor wafers. A respective wafer map is formed for each of the wafers based on the collected test data set. The method also includes determining whether each respective wafer map comprises one or more respective objects. The wafer maps that are determined to comprise one or more respective objects are selected. One or more object indices for selecting a respective object in each respective selected wafer map are selected. The method further includes determining a plurality of object index values in each respective selected wafer map using each of the respective selected one or more object indices. An object in each respective selected wafer map is selected based on the determined plurality of object index values. A respective feature in each of the respective selected wafer maps is determined using the respective selected object in each respective selected wafer map, the determined plurality of object index values for the respective selected object, and stored feature information. A respective pattern for each of the respective selected wafer maps is classified using the respective determined feature and stored pattern information for a plurality of stored patterns. A respective wafer fingerprint is formed for each of the respective selected wafer maps using the respective classified pattern and the stored pattern information. The respective wafer fingerprints are used to adjust one or more parameters of the semiconductor fabrication process.

Another embodiment provides a computer readable storage medium having instructions stored tangibly thereon, the instructions when executed by a processor cause the processor to perform the operations of: receiving a test data set collected from testing a plurality of semiconductor wafers, forming a respective wafer map for each of the wafers based on the collected test data set, determining whether each respective wafer map comprises one or more respective objects, selecting the wafer maps that are determined to comprise one or more respective objects, selecting one or more object indices for selecting a respective object in each respective selected wafer map, determining a plurality of object index values in each respective selected wafer map using each of the respective selected one or more object indices, selecting an object in each respective selected wafer map based on the determined plurality of object index values, determining a respective feature in each of the respective selected wafer maps using the respective selected object in each respective selected wafer map, the determined plurality of object index values for the respective selected object, and stored feature information; classifying a respective pattern for each of the respective selected wafer maps using the respective determined feature and stored pattern information for a plurality of stored patterns, forming a respective wafer fingerprint for each of the respective selected wafer maps using the respective classified pattern and the stored pattern information and using the respective wafer fingerprints to adjust one or more parameters of the semiconductor fabrication process.

A further embodiment provides a system for automatically detecting failure patterns for a semiconductor wafer process. The system includes a monitoring device to monitor a plurality of semiconductor wafers for failure test data. A data retrieval device is included to retrieve a failure test data set for each semiconductor wafer of the plurality of semiconductor wafers from the monitored failure test data. A wafer map generating device is included to form a respective wafer map for each semiconductor wafer of the plurality of semiconductor wafers based on the respective retrieved failure test data set. The system also includes an index determining device to determine one or more object indices for selecting a respective object in each of the respective wafer maps. A first data determining device is provided to determine a plurality of object index values in each respective selected wafer map using each of the respective selected one or more object indices. A database is included to store feature information and pattern information for a plurality of patterns. A second data determining device is included to determine a respective feature in each of the respective wafer maps using a respective selected object in each respective wafer map, the determined plurality of object index values for the respective selected object, and stored feature information. The system further includes a data classifying device to classify a respective pattern for each of the respective wafer maps using the respective determined feature and the stored pattern information, a generator to generate a respective wafer fingerprint for each of the respective wafer maps using the respective classified pattern and the stored pattern information, and an interface to provide the respective wafer fingerprints to a controller to adjust one or more parameters of the semiconductor fabrication process.

While various embodiments have been described, it is to be understood that the embodiments described are illustrative only and that the scope of the subject matter is to be accorded a full range of equivalents, many variations and modifications naturally occurring to those of skill in the art from a perusal hereof.

What we claim is:

1. A method of fabricating semiconductor wafers using automatically detected failure patterns, comprising:
   forming respective wafer fingerprints by selecting a respective object of one or more objects in a respective wafer map of a plurality of wafer maps;
   determining a respective feature in each of the respective wafer maps using the respective selected object,
   classifying a respective pattern for each of the respective wafer maps using the respective determined feature and stored pattern information, and identifying a semiconductor wafer fabrication process or tool requiring adjustment using the respective wafer fingerprints formed for each of the plurality of wafer maps, wherein at least one of the forming, determining, classifying and identifying steps is performed by a computer.

2. The method of claim 1, further comprising:
adjusting the identified semiconductor wafer fabrication process or tool using the respective wafer fingerprints.

3. The method of claim 2, further comprising:
fabricating a plurality of semiconductor wafers using the adjusted identified semiconductor wafer fabrication process or tool.

4. The method of claim 1, wherein the step of identifying comprises identifying the semiconductor wafer fabrication process or tool requiring adjustment using a respective wafer fingerprint and its corresponding respective classified pattern.

5. The method of claim 1, further comprising:
adjusting a parameter of the identified semiconductor wafer fabrication process or tool using the respective wafer fingerprints.

6. The method of claim 5, wherein the parameter is selected from the group consisting of: active process parameters, passive process parameters, design parameters, layout parameters, and combinations thereof.

7. The method of claim 1, wherein the identified semiconductor wafer fabrication process or tool is a deposition, chemical dispensing, wafer handling, wafer transfer, or photo-lithography process or tool.

8. The method of claim 1, wherein the
determining a respective feature in each of the respective wafer maps includes using the respective selected object and stored feature information.

9. The method of claim 8, wherein the respective wafer fingerprints are further formed by:
selecting one or more object indices for selecting objects; and
determining a plurality of object index values in each respective wafer map using the selected one or more object indices;
wherein the step of selecting an object in each respective wafer map is based on the determined plurality of object index values.

10. The method of claim 9, wherein the step of determining a respective feature in each of the respective wafer maps further comprises determining a respective feature point using the determined plurality of object index values and a plurality of stored feature points for a plurality of stored patterns.

11. A method of fabricating semiconductor wafers using automatically detected failure patterns, comprising:
adjusting one or more parameters of a semiconductor wafer fabrication process or tool using respective wafer fingerprints formed for each of a plurality of wafer maps comprising one or more respective objects, wherein the respective wafer maps are formed by:
determining a plurality of object index values in each respective wafer map;
selecting an object in each respective wafer map using the determined plurality of object index values;
determining a respective feature in each of the respective wafer maps using the respective selected object and stored feature information;
classifying a respective pattern for each of the respective wafer maps using the respective determined feature and stored pattern information for a plurality of stored patterns; and using the respective classified pattern and the stored pattern information to form the respective wafer fingerprints,
wherein at least one of the steps of adjusting, determining a plurality of object index values, selecting, determining a respective feature, classifying and using is performed by a computer.

12. The method of claim 11, further comprising:
fabricating a plurality of semiconductor wafers using the adjusted one or more parameters of the semiconductor wafer fabrication process or tool.

13. The method of claim 11, wherein the one or more parameters are selected from the group consisting of: active process parameters, passive process parameters, design parameters, layout parameters, and combinations thereof.

14. The method of claim 11, wherein the respective wafer fingerprints are further formed by:
selecting one or more object indices for selecting objects in each respective wafer map;
wherein the step of determining a plurality of object index values in each respective wafer map further comprises using the respective selected one or more object indices;
and wherein the step of determining a respective feature in each of the respective wafer maps further comprises using the determined plurality of object index values for the respective selected object.

15. A system for fabricating semiconductor wafers using automatically detected failure patterns, comprising:
a controller to adjust one or more parameters of a semiconductor wafer fabrication process or tool using respective wafer fingerprints provided to the controller via an interface for each of a plurality of wafer maps comprising one or more respective objects; and
a generator to generate the respective wafer fingerprints using respective classified patterns using respective features and stored pattern information, said respective features determined based on respective selected objects of said one or more respective objects.

16. The system of claim 15, further comprising:
a wafer fabrication device to fabricate a plurality of semiconductor wafers using the adjusted one or more parameters of the semiconductor fabrication process or tool.

17. The system of claim 15, further comprising:
a first data determining device to determine the respective feature in each of the plurality of wafer maps using the respective selected object in each respective wafer map and stored feature information; and
a data classifying device to classify the respective classified pattern for each of the respective wafer maps using the respective determined feature and the stored pattern information.

18. The system of claim 17, further comprising:
an index determining device to determine one or more object indices for selecting a respective object in each respective wafer map; and
a second data determining device to determine a plurality of object index values in each respective wafer map using the determined one or more object indices.

19. The system of claim 18, wherein the first data determining device is further to determine a respective feature in each of the plurality of wafer maps using a respective selected object in each respective wafer map, the determined plurality of object index values for the respective selected object, and stored feature information.

* * * * *